United States Patent
Hamamoto et al.

(10) Patent No.: US 9,847,483 B1
(45) Date of Patent: Dec. 19, 2017

(54) DEVICE AND METHOD FOR PATTERNING SUBSTRATE, AND METHOD OF MANUFACTURING ORGANIC LIGHT-EMITTING DEVICE

(71) Applicant: Samsung Electronics Co., Ltd., Suwon-si, Gyeonggi-do (KR)

(72) Inventors: Nobuo Hamamoto, Suwon-si (KR); Makoto Odawara, Hwaseong-si (KR); Sunghwan Cho, Hwaseong-si (KR)

(73) Assignee: SAMSUNG ELECTRONICS CO., LTD., Gyeonggi-Do (KR)

( * ) Notice: Subject to any disclaimer, the term of this patent is extended or adjusted under 35 U.S.C. 154(b) by 0 days.

(21) Appl. No.: 15/378,763

(22) Filed: Dec. 14, 2016

(30) Foreign Application Priority Data

Jul. 5, 2016 (KR) .......................... 10-2016-0085068

(51) Int. Cl.
| | | |
|---|---|---|
| *H01L 51/00* | (2006.01) | |
| *H01L 27/32* | (2006.01) | |
| *H01L 21/67* | (2006.01) | |

(52) U.S. Cl.
CPC ...... *H01L 51/0003* (2013.01); *H01L 21/6715* (2013.01); *H01L 27/3211* (2013.01); *H01L 51/0014* (2013.01)

(58) Field of Classification Search
CPC ............ H01L 51/0003; H01L 21/6715; H01L 27/3211; H01L 51/0014
See application file for complete search history.

(56) References Cited

U.S. PATENT DOCUMENTS

| | | | |
|---|---|---|---|
| 8,623,696 B2 * | 1/2014 | Cho | H01L 51/0005 257/40 |
| 2004/0155846 A1 * | 8/2004 | Hoffman | H01L 27/1214 345/87 |
| 2007/0202258 A1 | 8/2007 | Yamagata et al. | |
| 2009/0152371 A1 * | 6/2009 | Stark | H01J 49/165 239/3 |
| 2017/0069842 A1 | 3/2017 | Hamamoto et al. | |

FOREIGN PATENT DOCUMENTS

| | | |
|---|---|---|
| JP | 2007229851 A | 9/2007 |
| JP | 2007305507 A | 11/2007 |
| JP | 20090036727 A | 2/2009 |
| JP | 2011175921 A | 9/2011 |
| JP | 2012135704 A | 7/2012 |
| JP | 2014180590 A | 9/2014 |

(Continued)

OTHER PUBLICATIONS

A.Jaworek et al., "Electrospraying route to nanotechnology: An overview", 2008, pp. 197-219, 66, Journal of Electrostatics.

(Continued)

*Primary Examiner* — Karen Kusumakar
(74) *Attorney, Agent, or Firm* — Cantor Colburn LLP

(57) ABSTRACT

A method of patterning a substrate includes applying a first potential to a spray nozzle, applying a second potential to at least one first cell electrode among a plurality of cell electrodes on a first surface of the substrate, applying a third potential to at least one second cell electrode excluding the at least one first cell electrode among the cell electrodes, and applying a fourth potential to a second surface that is opposite to the first surface of the substrate.

16 Claims, 27 Drawing Sheets

(56) References Cited

FOREIGN PATENT DOCUMENTS

| JP | 2015054269 A | 3/2015 |
|---|---|---|
| JP | 20150054269 A | 3/2015 |
| KR | 1020000039074 A | 7/2000 |
| KR | 1020080065769 A | 7/2008 |
| KR | 1020140134508 A | 10/2014 |
| KR | 1020150024649 A | 3/2015 |
| KR | 1020150124839 A | 9/2015 |
| WO | 2008044737 A1 | 4/2008 |
| WO | 2009060898 A1 | 5/2009 |
| WO | 2013105557 A1 | 7/2013 |
| WO | 2013105558 A1 | 7/2013 |

OTHER PUBLICATIONS

J.M. Lopez-Herrera et al., "Coaxial jets generated from electrified Taylor cones. Scaling laws", 2003, pp. 535-552, 34, Journal of Aerosol Science.

Lord Rayleigh, Conducting Masses Charged with Electricity, 1882, pp. 184-186, 14.

N. Hamamoto et al., "Experimental Discussion on Maximum Surface Charege Density of Fine Particles Sustainable in the Atmosphere", 1991, pp. 452-458, 15, 6.

Yasushi Koishikawa et al., Multi-layered organic light-emitting diode fabrication using low molecular weight materials by electrospray method, 2013, pp. 527-532, 545, Thin Solid Films, Elsevier.

Yoshiyuki Seike et al., The Study of Film Formation Process by Using an Electrospray Method to Manufacture High-Productivity OLED Devices, p. 164, Asahi Sunac corporation, Aichi, Japan.

\* cited by examiner

FIG. 18
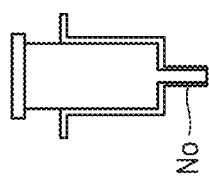
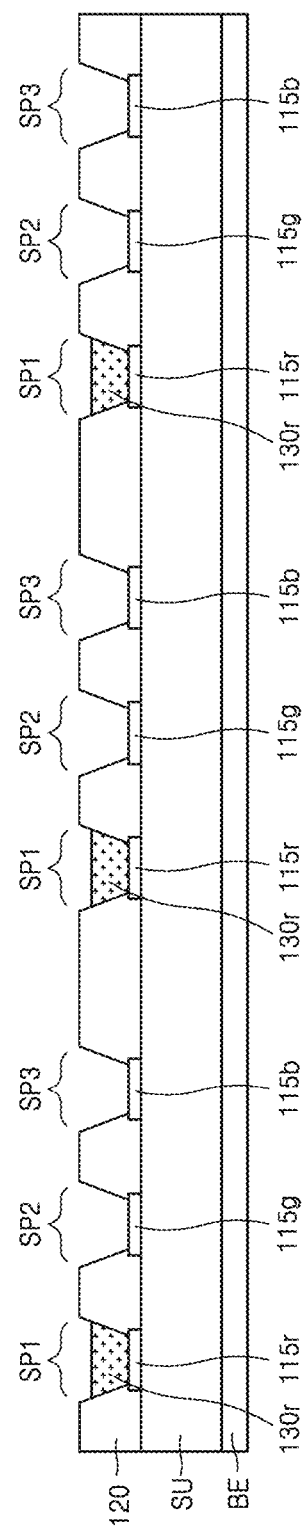

FIG. 20
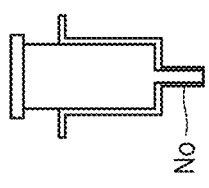
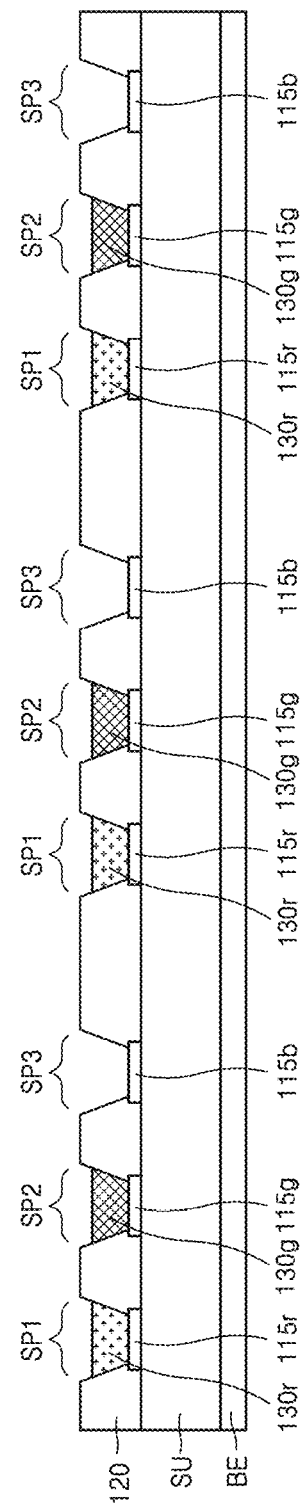

FIG. 22
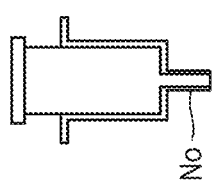
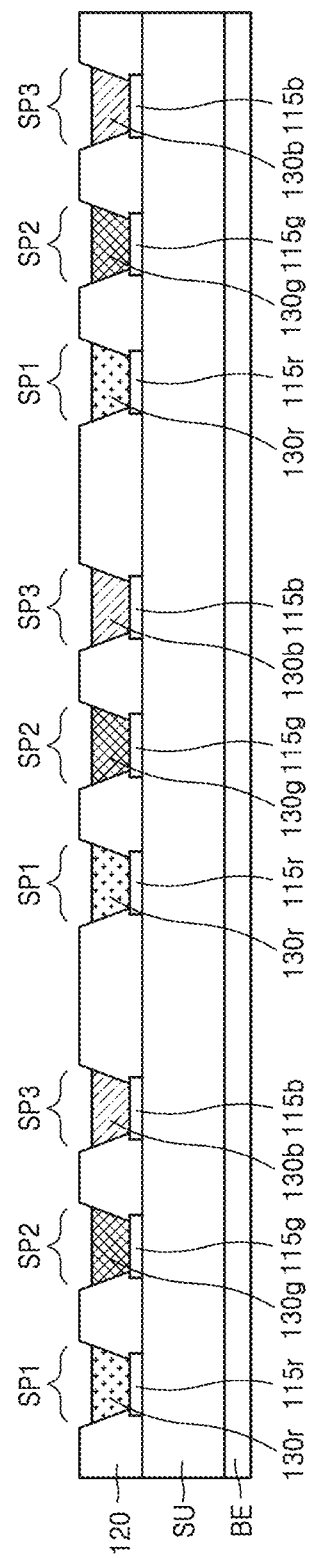

DEVICE AND METHOD FOR PATTERNING SUBSTRATE, AND METHOD OF MANUFACTURING ORGANIC LIGHT-EMITTING DEVICE

CROSS-REFERENCE TO RELATED APPLICATION

This application claims priority to Korean Patent Application No. 10-2016-0085068, filed on Jul. 5, 2016, and all the benefits accruing therefrom under 35 U.S.C. §119, the content of which in its entirety is herein incorporated by reference.

BACKGROUND

1. Field

Embodiments of the present disclosure relate to devices and methods of patterning a substrate, and methods of manufacturing an organic light-emitting device using the methods of patterning a substrate, and more particularly, to devices and methods of patterning a substrate which deposit a patterning solution on a predetermined area of the substrate.

2. Description of the Related Art

An organic light-emitting device is an active emission display device and has various advantages such as wide viewing angles, high contrast ratios, and short response times. Thus, the organic light-emitting device is considered as a next-generation display device.

The organic light-emitting device generally includes an anode prepared by forming a predetermined pattern on a transparent insulating substrate including glass or another material, and an organic material and a cathode sequentially stacked on the anode in the stated order. When a voltage is applied to the prepared anode and cathode of the organic light-emitting device, holes provided from the anode may move toward an emission layer through a hole transport layer, and electrons provided from the cathode may move toward the emission layer through an electron transport layer. The holes and the electrons are recombined in the emission layer to produce excitons. These excitons change from an excited state to a ground state, thereby displaying an image as organic molecules in the emission layer emit light.

In order to manufacture an organic light-emitting device which produces a full-color image, for example, red (R), green (G), and blue (B) sub-pixels are generally formed on a substrate using a mask in which an opening of a predetermined pattern is defined.

SUMMARY

Provided are devices and methods of patterning a substrate, and methods of manufacturing an organic light-emitting device using the methods of patterning a substrate.

Additional embodiments will be set forth in part in the description which follows and, in part, will be apparent from the description, or may be learned by practice of the presented embodiments.

According to an embodiment, a method of patterning a substrate using a patterning solution includes applying a first potential to a spray nozzle, applying a second potential to at least one first cell electrode among a plurality of cell electrodes on a first surface of the substrate, applying a third potential to at least one second cell electrode excluding the at least one first cell electrode among the plurality of cell electrodes, applying a fourth potential to a second surface that is opposite to the first surface of the substrate, and selectively depositing the patterning solution on the at least one first cell electrode by spraying the patterning solution from the spray nozzle to the first surface of the substrate, where the second potential may be different from each of the first potential, the third potential, and the fourth potential.

In an embodiment, the first to fourth potentials may be adjusted in a manner where a first parameter [SF], a second parameter [CF], and a third parameter [RF] satisfy Numerical inequation 1, $$\frac{\varepsilon_s \cdot [RF]}{\varepsilon_0 \cdot [SF]} > -4.75 \times \frac{CF}{SF} + 38 \quad \text{[Numerical inequation 1]}$$

and the first to third parameters [SF], [CF], and [RF] may be defined as described below:

$$[SF] \equiv \frac{V1 - V2}{d1},\ [CF] \equiv \frac{V3 - V2}{d2},\ [RF] \equiv \frac{V4 - V2}{d3}$$

where $\varepsilon_S$ denotes a dielectric constant of the substrate, $\varepsilon_0$ denotes a dielectric constant of air, V1 denotes the first potential, V2 denotes the second potential, V3 denotes the third potential, V4 denotes the fourth potential, d1 denotes a distance between the spray nozzle and the first cell electrode, d2 denotes a distance between the first cell electrode and the second cell electrode, and d3 denotes a thickness of the substrate.

In an embodiment, the spray nozzle may have a needle shape with a sharp end, and a ring electrode having a ring shape may be provided between the spray nozzle and the substrate, and the method of patterning a substrate using a patterning solution may further include applying a fifth potential to the ring electrode, where the fifth potential may be different from the first to fourth potentials.

In an embodiment, the second to fifth potentials may be adjusted in a manner where a first parameter [SF], a second parameter [CF], and a third parameter [RF] satisfy Numerical inequation 1, $$\frac{\varepsilon_s \cdot [RF]}{\varepsilon_0 \cdot [SF]} > -4.75 \times \frac{CF}{SF} + 38 \quad \text{[Numerical inequation 1]}$$

and the first to third parameters [SF], [CF], and [RF] may be defined as described below:

$$[SF] \equiv \frac{V5 - V2}{h1},\ [CF] \equiv \frac{V3 - V2}{h2},\ [RF] \equiv \frac{V4 - V2}{h3}$$

where $\varepsilon_S$ denotes a dielectric constant of the substrate, $\varepsilon_0$ denotes a dielectric constant of air, V2 denotes the second potential, V3 denotes the third potential, V4 denotes the fourth potential, V5 denotes the fifth potential, h1 denotes a distance between the ring electrode and the first cell electrode, h2 denotes a distance between the first cell electrode and the second cell electrode, and h3 denotes a thickness of the substrate.

In an embodiment, an intermediate electrode layer in which a plurality of through holes is defined may be provided between the spray nozzle and the substrate, and the method of patterning a substrate using a patterning solution may further include applying a fifth potential that is different from the first to fourth potentials to the intermediate electrode layer.

In an embodiment, the second to fifth potentials may be adjusted in a manner where a first parameter [SF], a second parameter [CF], and a third parameter [RF] satisfy Numerical inequation 1, $$\frac{\varepsilon_s \cdot [RF]}{\varepsilon_0 \cdot [SF]} > -4.75 \times \frac{CF}{SF} + 38 \qquad \text{[Numerical inequation 1]}$$

and the first to third parameters [SF], [CF], and [RF] may be defined as described below:

$$[SF] \equiv \frac{V5 - V2}{h4}, [CF] \equiv \frac{V3 - V2}{h2}, [RF] \equiv \frac{V4 - V2}{h3}$$

where $\varepsilon_S$ denotes a dielectric constant of the substrate, $\varepsilon_0$ denotes a dielectric constant of air, V2 denotes the second potential, V3 denotes the third potential, V4 denotes the fourth potential, V5 denotes the fifth potential, h4 denotes a distance between the intermediate electrode layer and the first cell electrode, h2 denotes a distance between the first cell electrode and the second cell electrode, and h3 denotes a thickness of the substrate.

In an embodiment, the intermediate electrode layer may be a punched metal.

In an embodiment, the plurality of through holes having a grid pattern may be defined in the intermediate electrode layer.

In an embodiment, each of the first potential, third potential, and fourth potential may have a positive potential value, and the second potential has a negative potential value.

According to an embodiment of another embodiment, a device for patterning a substrate using a patterning solution includes a spray nozzle spraying the patterning solution toward a first surface of the substrate, a back electrode disposed on a second surface that is opposite to the first surface of the substrate, and a plurality of cell electrodes disposed on the first surface of the substrate, and a voltage driving unit adjusting potentials of the spray nozzle and the back electrode, where the voltage driving unit applies a first potential to the spray nozzle, applies a second potential to at least one first cell electrode among the plurality of cell electrodes, applies a third potential to at least one second cell electrode excluding the at least one first cell electrode among the cell electrodes, and applies a fourth potential to the back electrode, and the second potential is different from each of the first potential, the third potential, and the fourth potential.

In an embodiment, the voltage driving unit may adjust the first to fourth potentials in a manner where a first parameter [SF], a second parameter [CF], and a third parameter [RF] satisfy Numerical inequation 1, $$\frac{\varepsilon_s \cdot [RF]}{\varepsilon_0 \cdot [SF]} > -4.75 \times \frac{CF}{SF} + 38 \qquad \text{[Numerical inequation 1]}$$

and the first to third parameters [SF], [CF], and [RF] may be defined as described below:

$$[SF] \equiv \frac{V1 - V2}{d1}, [CF] \equiv \frac{V3 - V2}{d2}, [RF] \equiv \frac{V4 - V2}{d3}$$

where $\varepsilon_S$ denotes a dielectric constant of the substrate, $\varepsilon_0$ denotes a dielectric constant of air, V1 denotes the first potential, V2 denotes the second potential, V3 denotes the third potential, V4 denotes the fourth potential, d1 denotes a distance between the spray nozzle and the first cell electrode, d2 denotes a distance between the first cell electrode and the second cell electrode, and d3 denotes a thickness of the substrate.

In an embodiment, the spray nozzle may have a needle shape with a sharp end, and the device for patterning a substrate using a patterning solution may further includes a ring electrode having a ring shape between the spray nozzle and the substrate, where the voltage driving unit may apply a fifth potential to the ring electrode, and the fifth potential may be different from the first to fourth potentials.

In an embodiment, the voltage driving unit may adjust the second to fifth potentials in a manner where a first parameter [SF], a second parameter [CF], and a third parameter [RF] satisfy Numerical inequation 1, $$\frac{\varepsilon_s \cdot [RF]}{\varepsilon_0 \cdot [SF]} > -4.75 \times \frac{CF}{SF} + 38 \qquad \text{[Numerical inequation 1]}$$

and the first to third parameters [SF], [CF], and [RF] may be defined as described below:

$$[SF] \equiv \frac{V5 - V2}{h1}, [CF] \equiv \frac{V3 - V2}{h2}, [RF] \equiv \frac{V4 - V2}{h3}$$

where $\varepsilon_S$ denotes the dielectric constant of the substrate, $\varepsilon_0$ denotes the dielectric constant of air, V2 denotes the second potential, V3 denotes the third potential, V4 denotes the fourth potential, V5 denotes the fifth potential, h1 denotes a distance between the ring electrode and the first cell electrode, h2 denotes a distance between the first cell electrode and the second cell electrode, and h3 denotes a thickness of the substrate.

In an embodiment, the device for patterning a substrate using a patterning solution may further include an intermediate electrode layer between the spray nozzle and the substrate and having a plurality of through holes, where the voltage driving unit may apply a fifth potential to the intermediate electrode layer, and the fifth potential may be different from the first to fourth potentials.

In an embodiment, the voltage driving unit may adjust the second to fifth potentials in a manner where a first parameter [SF], a second parameter [CF], and a third parameter [RF] satisfy Numerical inequation 1, $$\frac{\varepsilon_s \cdot [RF]}{\varepsilon_0 \cdot [SF]} > -4.75 \times \frac{CF}{SF} + 38 \qquad \text{[Numerical inequation 1]}$$

and the first to third parameters [SF], [CF], and [RF] may be defined as described below:

$$[SF] \equiv \frac{V5 - V2}{h4}, [CF] \equiv \frac{V3 - V2}{h2}, [RF] \equiv \frac{V4 - V2}{h3}$$

where $\in_S$ denotes a dielectric constant of the substrate, $\in_0$ denotes a dielectric constant of air, V2 denotes the second potential, V3 denotes the third potential, V4 denotes the fourth potential, V5 denotes the fifth potential, h4 denotes a distance between the intermediate electrode layer and the first cell electrode, h2 denotes a distance between the first cell electrode and the second cell electrode, and h3 denotes a thickness of the substrate.

In an embodiment, the intermediate electrode layer may be a punched metal.

In an embodiment, the plurality of through holes having a grid pattern may be defined in the intermediate electrode layer.

According to another embodiment, a method of manufacturing an organic light-emitting device includes a plurality of sub-pixel areas having a plurality of pixels of different colors using an organic-solution spray nozzle includes forming the plurality of sub-pixel areas on a first surface of the substrate, applying a first potential to the organic-solution spray nozzle, applying a second potential to a first sub-pixel area included in the plurality of sub-pixel areas, applying a third potential to remaining sub-pixel areas excluding the first sub-pixel area among the plurality of sub-pixel areas, applying a fourth potential to a second surface that is opposite to the first surface of the substrate, and selectively depositing a first organic solution on the first sub-pixel area by spraying the first organic solution from the organic-solution spray nozzle to the first surface of the substrate, where the second potential may be different from each of the first potential, the third potential, and the fourth potential.

In an embodiment, the plurality of sub-pixel areas may include the first sub-pixel area, and second and third sub-pixel areas, and the method of manufacturing an organic light-emitting device may further include applying the second potential to the second sub-pixel area, and the third potential to the first and third sub-pixel areas, selectively depositing a second organic solution on the second sub-pixel area by spraying the second organic solution from the organic-solution spray nozzle to the first surface of the substrate, applying the second potential to the third sub-pixel area, and the third potential to the first and third sub-pixel areas, and selectively depositing a third organic solution on the third sub-pixel area by spraying the third organic solution from the organic-solution spray nozzle to the first surface of the substrate.

In an embodiment, each of the first to third organic-solutions may emit at least one of red, green, and blue colors.

BRIEF DESCRIPTION OF THE DRAWINGS

These and/or other embodiments will become apparent and more readily appreciated from the following description of the embodiments, taken in conjunction with the accompanying drawings in which:

FIG. 18 is a view of a resultant according to a deposition process of droplets of a first organic solution illustrated in FIG. 17;

FIG. 20 is a view of a resultant according to the deposition process of the droplets of the second organic solution illustrated in FIG. 19;

FIG. 22 is a view of a resultant according to the deposition process of the droplets of the third organic solution illustrated in FIG. 21;

DETAILED DESCRIPTION

Figure 1:
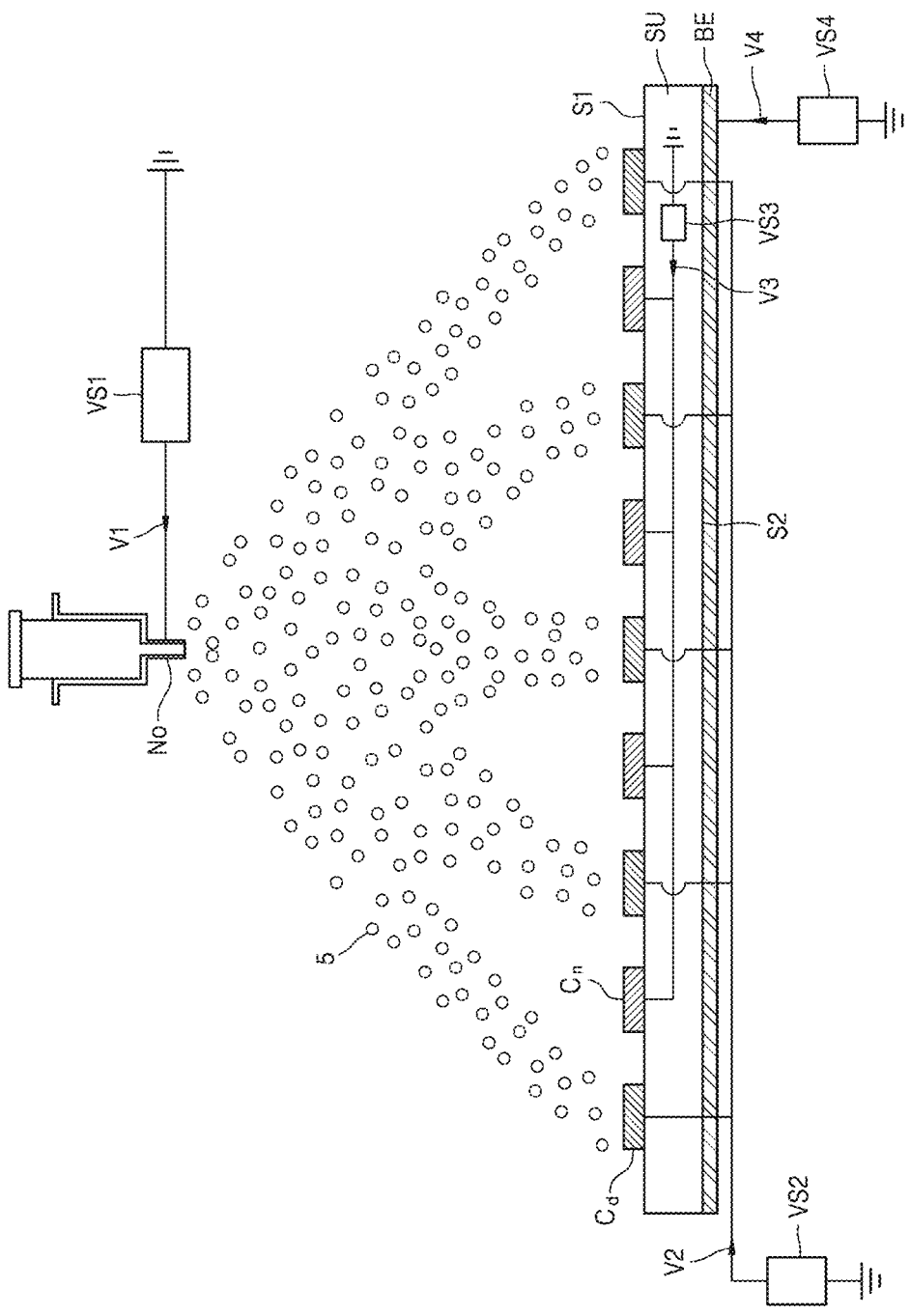
FIG. 1 is a schematic view of patterning a substrate using a substrate patterning device according to an embodiment.

Reference will now be made in detail to embodiments, examples of which are illustrated in the accompanying drawings, where like reference numerals refer to like elements throughout. In this regard, the embodiments may have different forms and should not be construed as being limited to the descriptions set forth herein. Accordingly, the embodiments are merely described below, by referring to the figures, to explain embodiments. Expressions such as "at least one of," when preceding a list of elements, modify the entire list of elements and do not modify the individual elements of the list.

Since the inventive concept may have diverse modified embodiments, preferred embodiments are illustrated in the drawings and are described in the detailed description. However, this does not limit the inventive concept within specific embodiments and it should be understood that the inventive concept covers all the modifications, equivalents, and replacements within the idea and technical scope of the inventive concept. In the description of the present disclosure, certain detailed explanations of the related art are omitted when it is deemed that they may unnecessarily obscure the essence of the inventive concept.

It will be understood that, although the terms first, second, etc. may be used herein to describe various elements, these elements should not be limited by these terms. These terms are only used to distinguish one element from another.

The terms used in this application, only certain embodiments have been used to describe, is not intended to limit the embodiments. As used herein, the singular forms "a", "an", and "the" are intended to include the plural forms as well, unless the context clearly indicates otherwise. It will be further understood that the terms "comprises" and/or "comprising" when used in this specification, specify the presence of stated features, integers, steps, operations, elements, and/or components, but do not preclude the presence or addition of one or more other features, integers, steps, operations, elements, components, and/or groups thereof.

Furthermore, relative terms, such as "lower" or "bottom" and "upper" or "top," may be used herein to describe one element's relationship to another element as illustrated in the Figures. It will be understood that relative terms are intended to encompass different orientations of the device in addition to the orientation depicted in the Figures. In an embodiment, when the device in one of the figures is turned over, elements described as being on the "lower" side of other elements would then be oriented on "upper" sides of the other elements. The exemplary term "lower," can therefore, encompasses both an orientation of "lower" and "upper," depending on the particular orientation of the figure. Similarly, when the device in one of the figures is turned over, elements described as "below" or "beneath" other elements would then be oriented "above" the other elements. The exemplary terms "below" or "beneath" can, therefore, encompass both an orientation of above and below.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±30%, 20%, 10%, 5% of the stated value.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and the invention, and will not be interpreted in an idealized or overly formal sense unless expressly so defined herein.

Embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. In an embodiment, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the claims.

FIG. 1 is a schematic view of patterning a substrate SU using a substrate patterning device according to an embodiment.

Referring to FIG. 1, the substrate patterning device according to an embodiment may include a spray nozzle No spraying a patterning solution toward a first surface S1 of the substrate SU, a back electrode BE disposed on a second surface S2 that is opposite to the first surface S1 of the substrate SU, a plurality of cell electrodes, for example, first and second cell electrodes $C_d$ and $C_n$ disposed on the first surface S1 of the substrate SU, and voltage driving units VS1, VS2, VS3, and VS4 adjusting potentials of the spray nozzle No and the back electrode BE.

The spray nozzle No may spray a patterning solution. A potential of the spray nozzle No may be adjusted by the first voltage driving unit VS1 of the voltage driving units VS1, VS2, VS3, and VS4. As the potential of the spray nozzle No is adjusted, a droplet 5 of the patterning solution sprayed from the spray nozzle No may be charged with a prescribed polarity. In an embodiment, when the spray nozzle No has a positive potential, the droplet 5 of the patterning solution may also be positively charged, for example. A shape of the droplet 5 of the patterning solution sprayed from the spray nozzle No may be determined by a surface tension of the droplet 5 and an electromagnetic force between charges included in the droplet 5.

The first surface S1 of the substrate SU may include a plurality of the first and second cell electrodes $C_d$ and $C_n$. A surface of the substrate SU may be patterned by depositing the droplet 5 of the patterning solution on at least some of the first and second cell electrodes $C_d$ and $C_n$. In an embodiment, a droplet of the patterning solution may be deposited on at least one of the first cell electrode $C_d$ among the plurality of the first and second cell electrodes $C_d$ and $C_n$, and the patterning solution may not be deposited on the second cell electrodes $C_n$ excluding the first cell electrodes $C_d$ among the first and second cell electrodes $C_d$ and $C_n$, for example. The first and second cell electrodes $C_d$ and $C_n$ may include conductive materials.

The back electrode BE may be provided on the second surface S2 of the substrate SU. A potential of the second surface S2 of the substrate may be changed by the back electrode BE. The back electrode BE may include conductive materials.

The voltage driving units VS1, VS2, VS3, and VS4 may apply different potentials to the spray nozzle No, the first cell electrode $C_d$, the second cell electrode $C_n$, and the back electrode BE, respectively. In an embodiment the voltage driving units VS1, VS2, VS3, and VS4 may include a first voltage driving unit VS1 adjusting the potential of the spray nozzle No, a second voltage driving unit VS2 adjusting a potential of the first cell electrode $C_d$, the third voltage driving unit VS3 adjusting a potential of the second cell electrode $C_n$, and a fourth voltage driving unit VS4 adjusting a potential of the back electrode BE, for example.

FIG. 1 illustrates the first to fourth voltage driving units VS1, VS2, VS3, and VS4 that are separated from each other, but an embodiment is not limited thereto. In another embodiment, the first to fourth voltage driving units VS1, VS2, VS3, and VS4 may be included in a single circuit, for example.

The first voltage driving unit VS1 may apply a first potential V1 to the spray nozzle No. In an embodiment the first potential V1 may have a positive potential value, for example. The droplet 5 sprayed from the spray nozzle No may be positively charged.

The second voltage driving unit VS2 may apply a second potential V2 to the first cell electrode $C_d$. The second potential V2 may have a ground potential or a negative potential that is less than the ground potential. The droplet 5 sprayed from the spray nozzle No may progress to the first cell electrode $C_d$ by Coulomb attraction.

The third voltage driving unit VS3 may apply a third potential V3 to the second cell electrode $C_n$. The third potential V3 may have a positive potential value. The droplet 5 sprayed from the spray nozzle No may receive Coulomb repulsion from the second cell electrode $C_n$.

Although the droplet 5 receives repulsion from the second cell electrode $C_n$, some of droplets 5 may be deposited on the second cell electrode $C_n$ or between the first cell electrode $C_d$ and the second cell electrode $C_n$ due to repulsion generated among the plurality of droplets 5. To avoid this, the fourth voltage driving unit VS4 may apply a fourth potential V4 of the back electrode BE to the second surface S2 of the substrate SU.

The fourth potential V4 may have a positive potential value. As the fourth potential V4 is applied to the second surface S2 of the substrate SU, electric field strength pushing the droplets 5 away from the second cell electrode $C_n$ or between the first and second cell electrodes $C_d$ and $C_n$ may be greater. Therefore, the droplets 5 of the patterning solution may be selectively deposited on the first cell electrode $C_d$. In the specification, an effect of selectively patterning the patterning solution on a predetermined area is referred to as a mask effect. According to the embodiment illustrated in FIG. 1, the second potential V2 may be different from each of the first potential V1, the third potential V3, and the fourth potential V4. In an embodiment, as illustrated in FIG. 1, the mask effect may be improved during a patterning process as each of the first potential V1, third potential V3, and fourth potential V4 has a potential value with a polarity that is different from that of the second potential V2, for example.

The embodiment described above illustratively shows that each of the first potential V1, third potential V3, and fourth potential V4 has a positive potential value, and the second potential V2 has a negative potential value. However, an embodiment is not limited thereto. In another embodiment, each of the first potential V1, third potential V3, and fourth potential V4 may have a negative potential value, and the second potential V2 may have a positive potential value, for example. In another embodiment, at least one of the first potential V1, third potential V3, and fourth potential may also have a ground potential.

Figure 2:
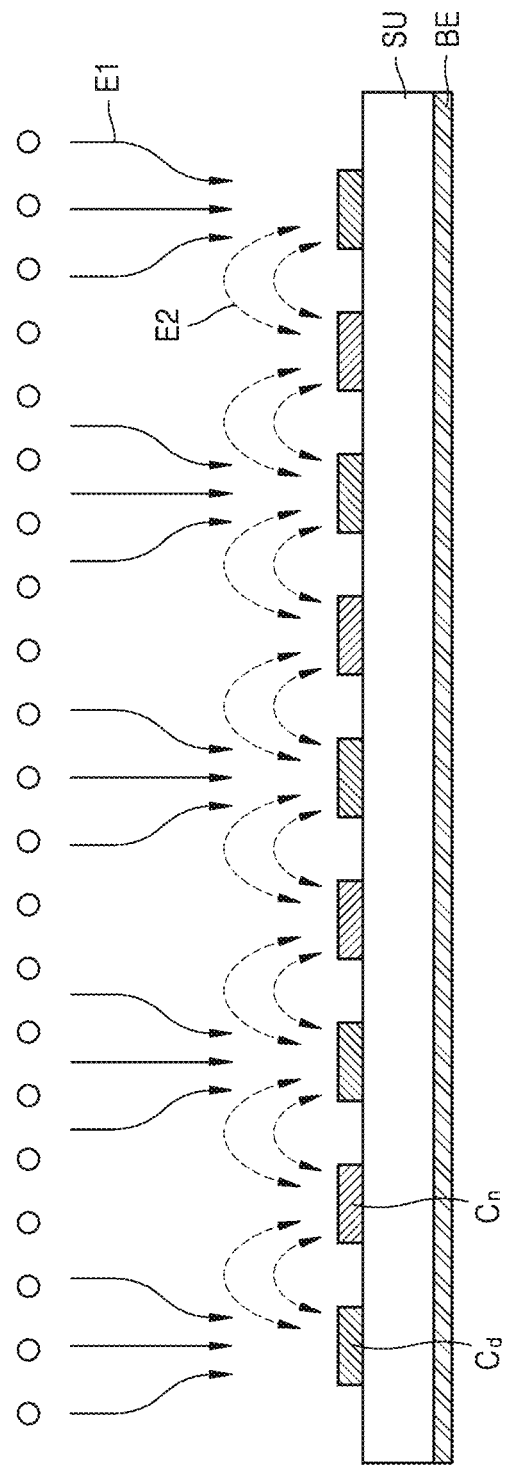
FIG. 2 is a schematic view of an electric field generated on a first surface of the substrate of FIG. 1.

FIG. 2 is a schematic view of an electric field generated on the first surface S1 of the substrate SU of FIG. 1.

Referring to FIG. 2, due to a potential difference between the first cell electrode $C_d$ and the spray nozzle No, a first electric field E1 (referring to FIG. 4) leading the plurality of droplets 5 to the first cell electrode $C_d$ may be generated on the first surface S1 of the substrate SU. Furthermore, due to a potential difference between the back electrode BE and the first cell electrode $C_d$ and a potential difference between the first and second cell electrodes $C_d$ and $C_n$, a second electric field E2 pushing the plurality of droplets 5 away from the second cell electrode $C_n$ may be generated on the first surface S1 of the substrate SU.

The mask effect described above may be improved as the strength of the first and second electric fields E1 and E2 increases. Furthermore, the mask effect may further be improved as the strength of the second electric field E2 increases to be greater than that of the first electric field E1.

The first electric field E1 may be affected by an electric field $E_{NC}$ (refer to FIG. 3) generated by the potential difference between the first cell electrode $C_d$ and the spray nozzle No. A first parameter indicating the first electric field E1 may be defined by Numerical equation 1.

$$[SF] \equiv \frac{V1 - V2}{d1} \qquad \text{[Numerical equation 1]}$$

In Numerical equation 1, [SF] is a first parameter indicating the strength of the first electric field E1 generated between the first cell electrode $C_d$ and the spray nozzle No due to the potential difference between the first cell electrode $C_d$ and the spray nozzle No. Furthermore, d1 indicates a distance between the first cell electrode $C_d$ and the spray nozzle No, V1 indicates a first potential, and V2 indicates a second potential. The first parameter [SF], which is a value obtained by dividing the potential difference between the first cell electrode $C_d$ and the spray nozzle No by the distance d1 between the first cell electrode $C_d$ and the spray nozzle No, may indicate the strength of the first electric field E1 generated between the first cell electrode $C_d$ and the spray nozzle No.

The second electric field E2 illustrated in FIG. 2 may depend on the electric field generated by the potential difference between the back electrode BE and the first cell electrode $C_d$, and the electric field generated by the potential difference between the first cell electrode $C_d$ and the second cell electrode $C_n$.

FIG. 3 is a schematic view of a third electric field $E_C$ generated by the potential difference between the first and second cell electrodes $C_d$ and $C_n$, and a fourth electric field $E_B$ generated by the potential difference between the back electrode BE and the first cell electrode $C_d$.

Referring to FIG. 3, the third electric field $E_C$ generated by the potential difference between the first and second cell electrodes $C_d$ and $C_n$, and the fourth electric field $E_B$ generated by the potential difference between the back electrode BE and the first cell electrode $C_d$ may be generated in a direction pushing the plurality of droplets 5 away from an unpatterned area. The second electric field E2 illustrated in FIG. 2 may depend on a sum of the third electric field $E_C$ and the fourth electric field $E_B$.

A second parameter indicating the third electric field $E_C$ may be defined by Numerical equation 2.

$$[CF] \equiv \frac{V3 - V2}{d2} \qquad \text{[Numerical equation 2]}$$

In Numerical equation 2, [CF] is a second parameter indicating the strength of the third electric field $E_C$ generated between the first and second cell electrodes $C_d$ and $C_n$ due to the potential difference between the first and second cell electrodes $C_d$ and $C_n$. Furthermore, d2 indicates a distance between the first and second cell electrodes $C_d$ and $C_n$, V2 indicates a second potential, and V3 indicates a third potential. The second parameter [CF], which is a value obtained by dividing the potential difference between the first and second cell electrodes $C_d$ and $C_n$ by the distance d2 between the first and second cell electrodes $C_d$ and $C_n$, may indicate the strength of the third electric field $E_C$.

Figure 3:
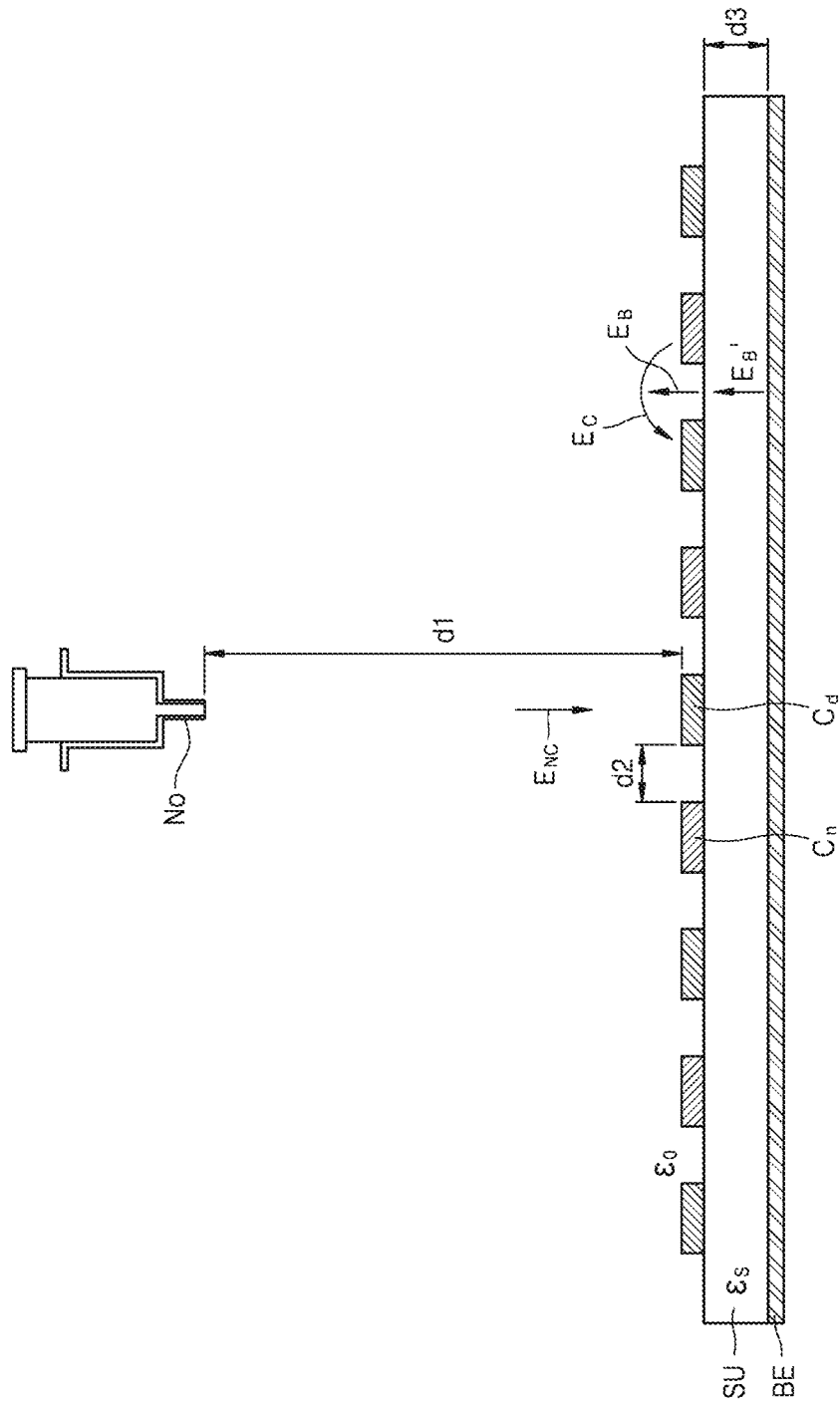
FIG. 3 is a schematic view of a third electric field generated by a potential difference between a first cell electrode and a second cell electrode, and a fourth electric field generated by a potential difference between a back electrode and the first cell electrode.

The fourth electric field $E_B$ illustrated in FIG. 3 may be different from an electric field $E_B'$ in the substrate SU because a dielectric constant of the substrate SU is different from the dielectric constant of air outside the substrate SU.

A third parameter [RF] indicating the electric field $E_B'$ generated in the substrate SU due to the potential difference between the back electrode BE and the first cell electrode $C_d$ may be defined by Numerical equation 3.

$$[RF] \equiv \frac{V4 - V2}{d3} \qquad \text{[Numerical equation 3]}$$

In Numerical equation 3, [RF] is a third parameter indicating the electric field $E_B'$ generated between the back electrode BE in the substrate SU and the first cell electrode $C_d$ due to the potential difference between the back electrode BE and the first cell electrode $C_d$. Furthermore, d3 indicates a thickness of the substrate SU, V4 indicates a fourth potential, and V2 indicates a second potential. The third parameter [RF], which is a value obtained by dividing the potential difference between the back electrode BE and the first cell electrode $C_d$ by the thickness d3 of the substrate SU, may indicate the strength of the electric field $E_B'$ in the substrate SU.

The strength of the fourth electric field $E_B$ of the substrate SU, which is illustrated in FIG. 3, may be determined from the third parameter [RF] indicating the strength of the electric field $E_B'$ in the substrate SU. In an embodiment, the strength of the fourth electric field $E_B$ may be defined by Numerical equation 4, for example.

$$E_B \approx [RF] \times \frac{\varepsilon_s}{\varepsilon_0} \qquad \text{[Numerical equation 4]}$$

In Numerical equation 4, $\varepsilon_s$ indicates a dielectric constant of the substrate SU, and $\varepsilon_0$ indicates the dielectric constant of air.

To obtain a higher mask effect, the second parameter [CF] may be relatively greater than the first parameter [SF]. Furthermore, approximate strength $$[RF] \times \frac{\varepsilon_s}{\varepsilon_0}$$

of the fourth electric field $E_B$ derived from the third parameter [RF] may be relatively greater than the first parameter [SF].

Considering the above, a fourth parameter [Cell Ratio] indicating a ratio between the second parameter [CF] and the first parameter [SF] may be defined by Numerical equation 5.

$$\text{[Ratio]} = [CF]/[SF] \qquad \text{[Numerical equation 5]}$$

Furthermore, a fifth parameter [Rear Ratio] indicating a ratio between the approximate strength $[RF] \times \varepsilon_s/\varepsilon_0$ of the fourth electric field $E_B$ and the first parameter [SF] may be defined by Numerical equation 6.

$$\text{[Rear Ratio]} \equiv \frac{[RF] \cdot \varepsilon_s}{[SF] \cdot \varepsilon_0} \qquad \text{[Numerical equation 6]}$$

A mask effect of a patterning process may be improved as the fourth parameter [Cell Ratio] and the fifth parameter [Rear Ratio] are greater. According to an embodiment, the voltage driving units VS1, VS2, VS3, and VS4 may adjust the first to fourth potentials V1 to V4 to have the fourth parameter [Cell Ratio] and the fifth parameter [Rear Ratio] satisfy Numerical inequation 7.

$$\text{[Rear Ratio]} > -4.75 \times \text{[Cell Ratio]} + 38 \qquad \text{[Numerical inequation 7]}$$

Numerical inequation 7 may be the same as Numerical inequation 8 by being represented by the first to third parameters.

$$\frac{\varepsilon_s \cdot [RF]}{\varepsilon_0 \cdot [SF]} > -4.75 \times \frac{[CF]}{[SF]} + 38 \qquad \text{[Numerical inequation 8]}$$

If the first to third parameters satisfy Numerical inequation 8, the droplets 5 of the patterning solution may be selectively patterned on the first cell electrode $C_d$ as the second electric field E2 is strongly generated as illustrated in FIG. 2.

The voltage driving units VS1, VS2, VS3, and VS4 adjust the first to fourth potentials V1 to V4, and thus, the first to third parameters may satisfy Numerical inequation 8. When the first to third parameters satisfy Numerical inequation 8, process quality may be higher as the mask effect of the patterning process is improved.

Figure 4:
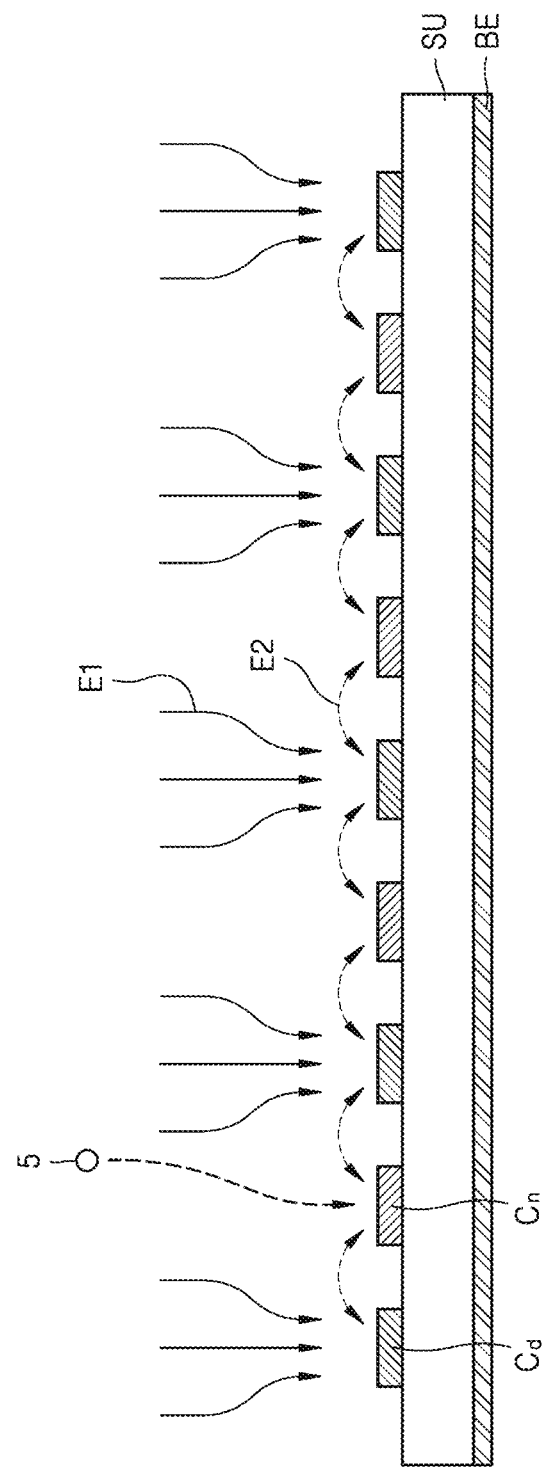
FIG. 4 is a schematic view of an electric field generated on a substrate when first to third parameters do not satisfy Numerical inequation 8.

FIG. 4 is a schematic view of an electric field generated on the substrate SU when the first to third parameters do not satisfy Numerical inequation 8.

Referring to FIG. 4, the strength of the second electric field E2 on the substrate SU may be reduced when the first to third parameters do not satisfy Numerical inequation 8. As the strength of the second electric field E2 is reduced, some of the droplets 5 of the patterning solution may be deposited on the second cell electrode $C_n$. Quality of the patterning process may be lowered.

FIGS. 1 to 3 illustrate that the first cell electrode $C_d$ is arranged in an odd-numbered row, and the second cell electrode $C_n$ is arranged in an even-numbered row, but an embodiment is not limited thereto.

Figure 5:
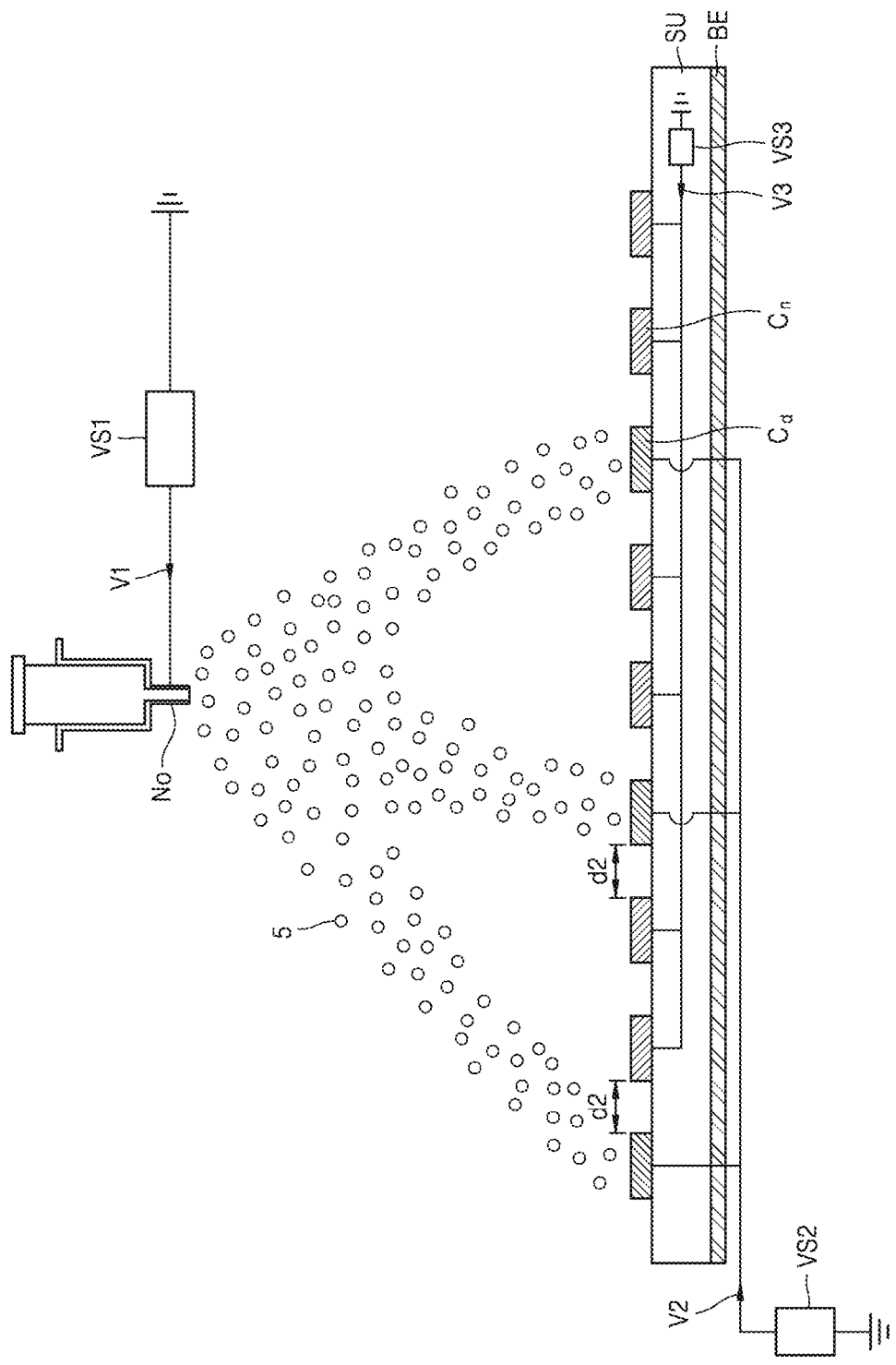
FIG. 5 is a view of a variation of the embodiment illustrated in FIG. 1.

FIG. 5 is a view of a variation of the embodiment illustrated in FIG. 1.

In an embodiment of FIG. 5, like reference numerals in FIGS. 1 to 4 denote like elements, and repeated descriptions thereof will be omitted. Referring to FIG. 5, the first cell electrode $C_d$ may be arranged in a 3n+1 (n=0, 1, 2 . . . ) row, and the second cell electrode $C_n$ may be arranged in a 3n, 3n+2 (n=0, 1, 2 . . . ) row. However, the embodiment of FIG. 5 is an only example, and thus, a ratio of an arrangement order and the number of the arrangement of the first and second cell electrodes $C_d$ and $C_n$ may vary.

FIGS. 1 to 5 illustrate examples of the first and second cell electrodes $C_d$ and $C_n$ disposed on the upper surface of the substrate SU. However, an embodiment is not limited thereto.

Figure 6:
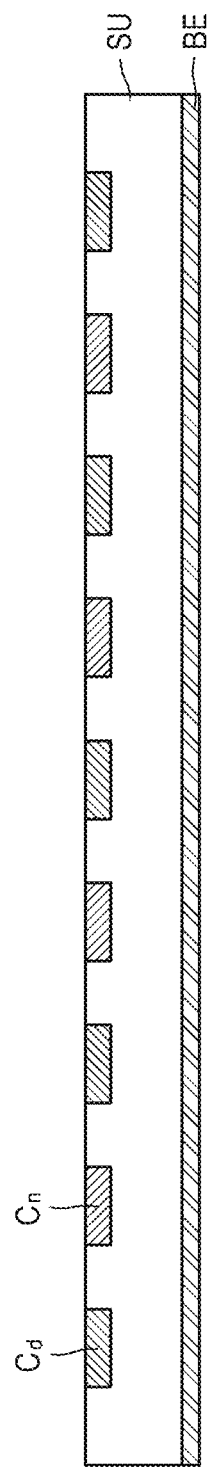
FIG. 6 is a view of a variation of the substrate illustrated in FIGS. 1 to 5.

FIG. 6 is a view of a variation of the substrate SU illustrated in FIGS. 1 to 5.

Referring to FIG. 6, the first and second cell electrodes $C_d$ and $C_n$ may be disposed under the upper surface of the substrate SU. Therefore, the surface of the substrate SU may be flat. As another example, the first and second cell electrodes $C_d$ and $C_n$ may be provided in a groove defined in the surface of the substrate SU.

Figure 7:
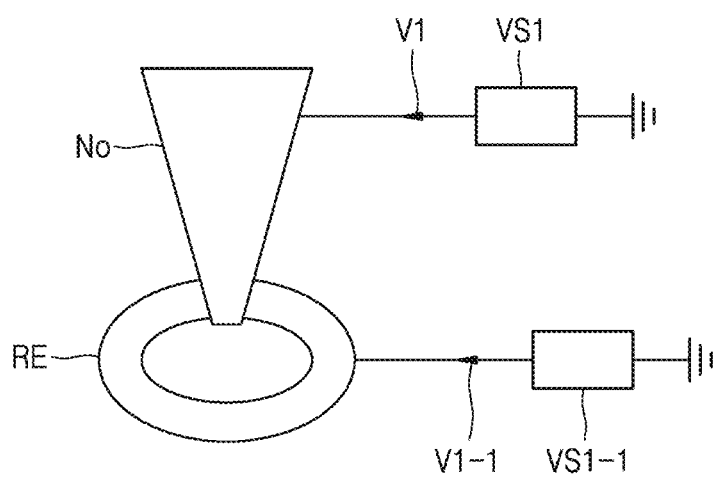
FIG. 7 is a view illustrating another example of a spray nozzle illustrated in FIGS. 1 to 5.

FIG. 7 is a view illustrating another example of the spray nozzle No illustrated in FIGS. 1 to 5.

Referring to FIG. 7, the spray nozzle No may have a needle shape with a sharp end. Furthermore, the first voltage driving unit VS1 may apply the first potential V1 to the needle-shaped spray nozzle No. When the spray nozzle No is needle-shaped, a size of the droplet 5 sprayed from the spray nozzle No may be smaller due to an electrospraying phenomenon.

The substrate patterning device may further include a ring electrode RE between the spray nozzle No and the substrate SU. The ring electrode RE may be ring-shaped. FIG. 7 illustrates that the ring electrode RE has a circular ring-shape, but an embodiment is not limited thereto. In other embodiments, the ring electrode RE may be square ring-shaped or oval ring-shaped, for example.

The voltage driving unit may further include a fifth voltage driving unit VS1-1 applying a fifth potential V1-1 to the ring electrode RE. The fifth potential V1-1 applied by the fifth voltage driving unit VS1-1 may have a potential value with the same polarity as that of the first potential V1. Therefore, the ring electrode RE may prevent the ring electrode RE from being deposited by a patterning solution with Coulomb force.

Furthermore, the fifth potential V1-1 may be different from the first potential V1. The plurality of droplets 5, which are sprayed from the spray nozzle No by the potential difference between the ring electrode RE and the spray nozzle No, may be leaded to pass through the ring electrode RE. The ring electrode RE may uniformly and widely spray the droplets 5.

Figure 8:
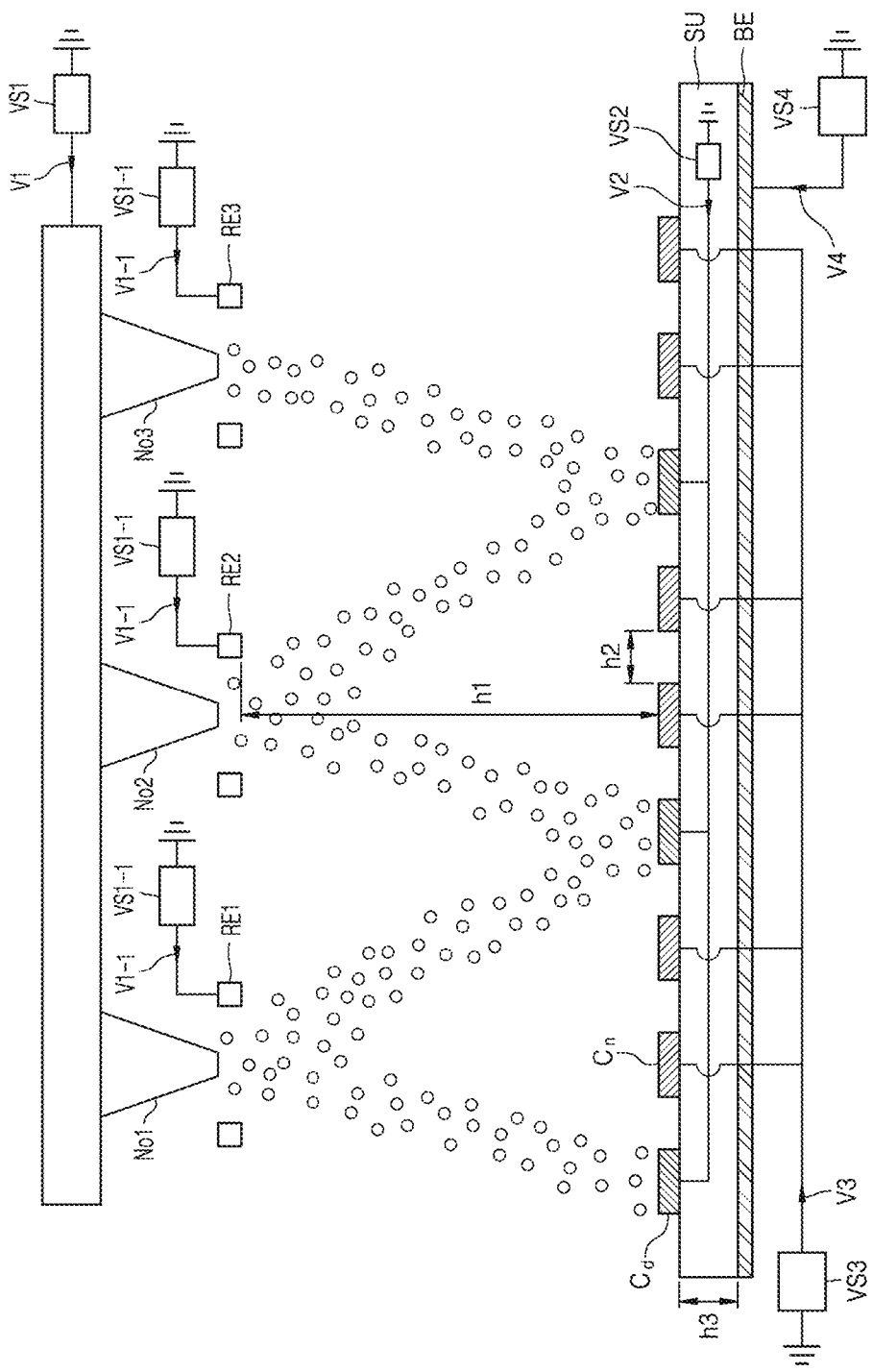
FIG. 8 is a view of a patterning process using a substrate patterning device including the spray nozzle and a ring electrode illustrated in FIG. 7.

FIG. 8 is a view of a patterning process using the substrate patterning device including spray nozzles No1, No2, and No3 and ring electrodes RE1, RE2, and RE3 illustrated in FIG. 7.

In an embodiment of FIG. 8, like reference numerals in FIGS. 1 to 5 denote like elements, and repeated descriptions thereof will be omitted. Furthermore, FIG. 8 illustrates that the spray nozzles No1, No2, and No3 and the ring electrodes RE1, RE2, and RE3 are plural, but an embodiment is not limited thereto. In an embodiment, the number of each of spray nozzles and ring electrodes may be less or greater than those illustrated in FIG. 8, for example.

Referring to FIG. 8, an electric field may be generated between the ring electrodes RE1, RE2, and RE3 and the first cell electrodes $C_d$ due to a potential difference between the ring electrodes RE1, RE2, and RE3 and the first cell electrodes $C_d$. Furthermore, droplets of the patterning solution may be leaded to the first cell electrodes $C_d$ by the electric field between the ring electrodes RE1, RE2, and RE3 and the first cell electrodes $C_d$.

In other words, the first electric field E1 illustrated in FIG. 2 may depend on the electric field between the ring electrodes RE1, RE2, and RE3 and the first cell electrodes $C_d$. Therefore, the embodiment illustrated in FIG. 8 is desired to separately define the first parameter [SF] when applying Numerical inequations 7 and 8. In an embodiment, the first parameter [SF] may be defined by Numerical equation 9, for example.

$$[SF] \equiv \frac{V5 - V2}{h1} \quad \text{[Numerical equation 9]}$$

In Numerical equation 9, V5 indicates a fifth potential applied to the ring electrode RE, and V2 indicates a second potential applied to the first cell electrode $C_d$. Furthermore, h1 indicates a distance between the first cell electrode $C_d$ and the ring electrode RE. The first parameter [SF], which is a value obtained by dividing the potential difference between the first cell electrode $C_d$ and the ring electrode RE by the distance h1 between the first cell electrode $C_d$ and the ring electrode RE, may indicate strength of the first electric field E1 generated between the first cell electrode $C_d$ and the ring electrode RE.

As illustrated in FIG. 8, when the ring electrode RE is provided when Numerical inequations 7 and 8 are applied, the first parameter [SF] may be defined by Numerical equation 9.

Figure 9:
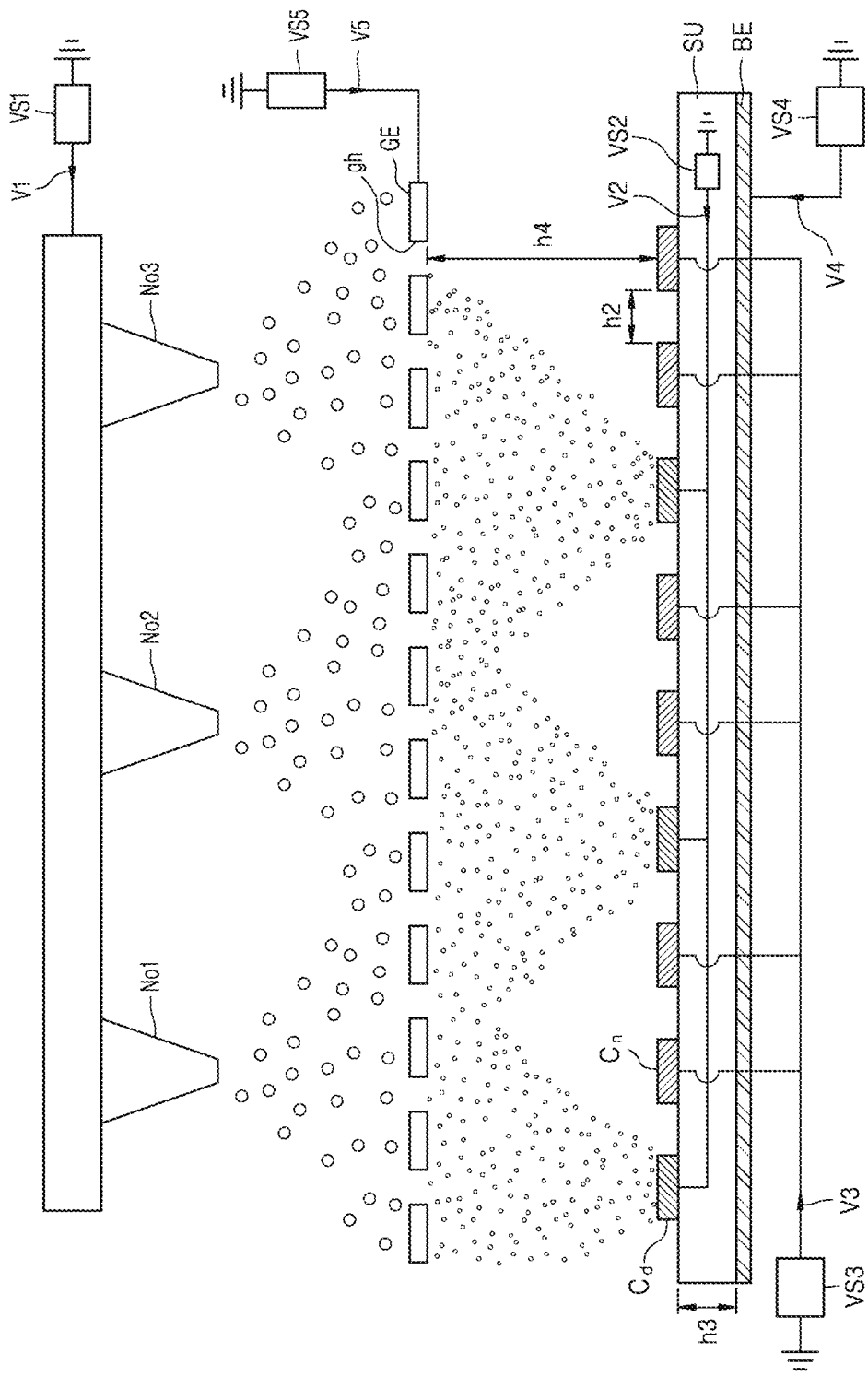
FIG. 9 is a schematic view of patterning a substrate using a substrate patterning device according to another embodiment.

FIG. 9 is a schematic view of patterning the substrate SU using the substrate patterning device according to another embodiment.

Referring to FIG. 9, the substrate patterning device may further include an intermediate electrode layer GE between the spray nozzles No1, No2 and No3 and the substrate SU. A plurality of through holes gh may be defined in the intermediate electrode layer GE. Droplets sprayed from the spray nozzle No may progress to the substrate SU after passing through the through holes gh.

The voltage driving unit may include a fifth voltage driving unit VS5 applying a fifth potential V5 to the intermediate electrode layer GE. Polarity of the fifth potential V5 applied by the fifth voltage driving unit VS5 may be the same as that of the first potential V1 applied to the spray nozzle No. Therefore, the droplets of the patterning solution may be prevented from being deposited on the intermediate electrode layer GE.

The fifth potential V5 applied to the intermediate electrode layer GE may be different from the first potential V1. Furthermore, the droplets of the patterning solution, which are sprayed from the spray nozzle No by the potential difference between the spray nozzle No and the intermediate electrode layer GE, may progress to the intermediate electrode layer GE. A size of each of the droplets may be reduced when the droplet of the patterning solution passes through a through hole gh defined in the intermediate electrode layer GE.

An electric field may be generated between the intermediate electrode layer GE and the first cell electrode $C_d$ due to a potential difference therebetween. Furthermore, the droplets of the patterning solution may be leaded to the first cell electrodes $C_d$ by the electric field between the intermediate electrode layer GE and the first cell electrode $C_d$.

In other words, the first electric field E1 illustrated in FIG. 2 may depend on the electric field between the intermediate electrode layer GE and the first cell electrode $C_d$ in the embodiment illustrated in FIG. 9. Therefore, the embodiment illustrated in FIG. 9 is desired to separately define the first parameter [SF] when applying Numerical inequations 7 and 8. In an embodiment, the first parameter [SF] may be defined by Numerical equation 10, for example.

$$[SF] \equiv \frac{V5 - V2}{h4} \qquad \text{[Numerical equation 10]}$$

In Numerical equation 10, V5 indicates a fifth potential applied to the intermediate electrode layer GE, and V2 indicates a second potential applied to the first cell electrode $C_d$. Furthermore, h4 indicates a distance between the first cell electrode $C_d$ and the intermediate electrode layer GE. The first parameter [SF], which is a value obtained by dividing the potential difference between the first cell electrode $C_d$ and the intermediate electrode layer GE by the distance h4 between the first cell electrode $C_d$ and the intermediate electrode layer GE, may indicate strength of the first electric field E1 generated between the first cell electrode $C_d$ and the intermediate electrode layer GE.

As illustrated in FIG. 9, when the ring electrode RE is provided when Numerical inequations 7 and 8 are applied, the first parameter [SF] may be defined by Numerical equation 10.

Figure 10:
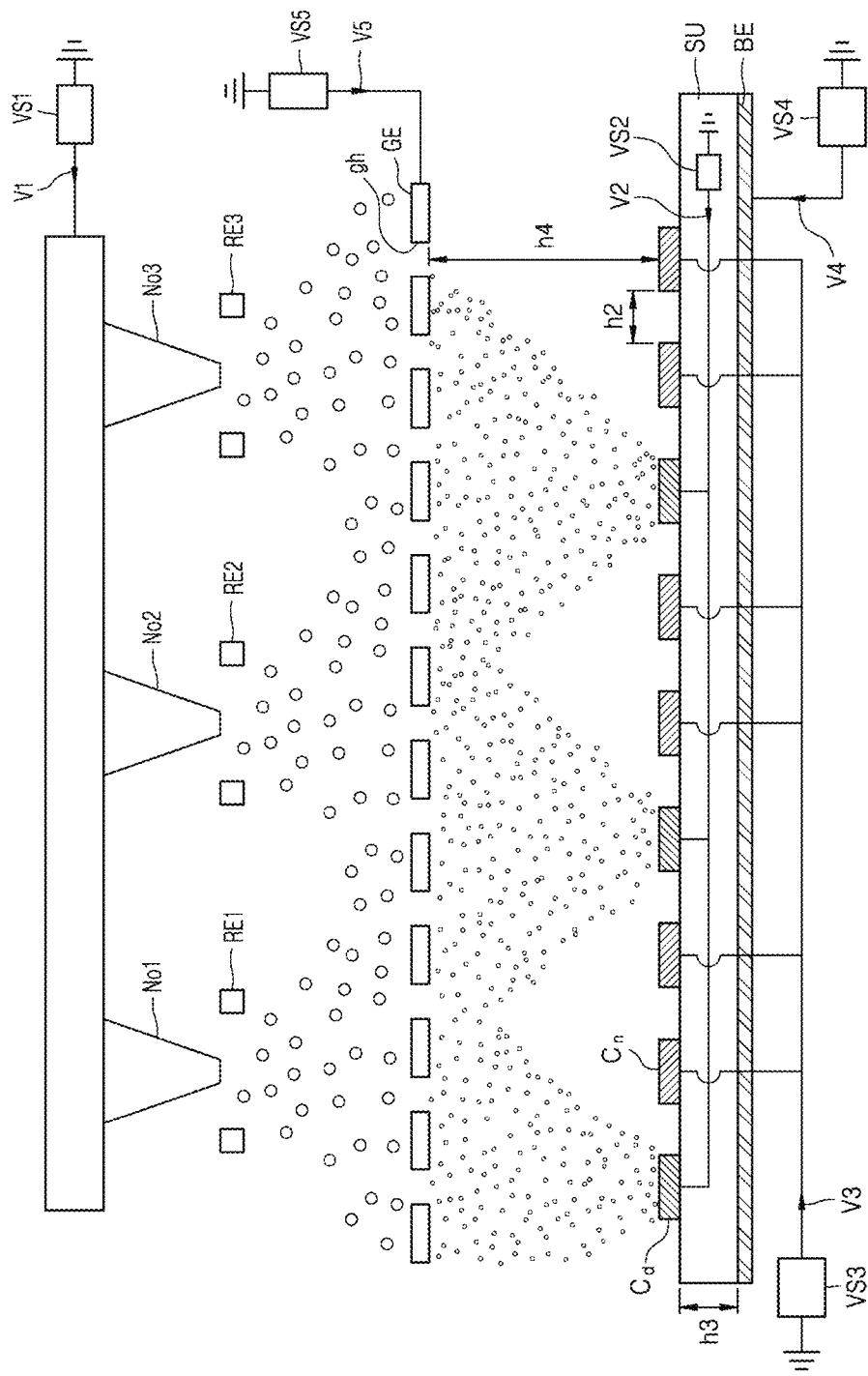
FIG. 10 is a schematic view of patterning a substrate using a substrate patterning device according to another embodiment.

FIG. 10 is a schematic view of patterning a substrate using a substrate patterning device according to another embodiment.

Referring to FIG. 10, the substrate patterning device may include the intermediate electrode layer GE between the spray nozzles No1, No2 and No3 and the substrate SU, and the ring electrodes RE1, RE2, and RE3 between the intermediate electrode layer GE and the spray nozzles No1, No2 and No3. In the embodiment illustrated in FIG. 10, the first parameter [SF] may be defined by Numerical equation 10.

Figure 11:
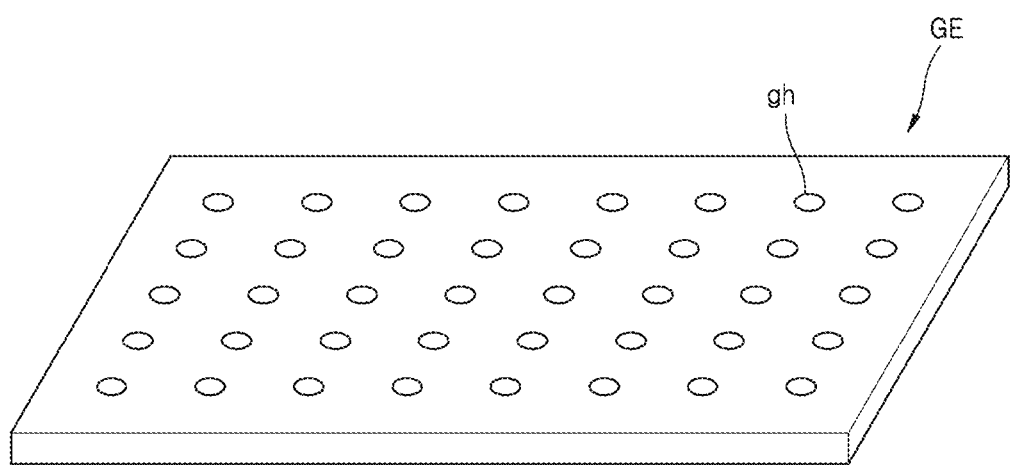
FIGS. 11 and 12 are exemplary perspective views of an intermediate electrode layer illustrated in FIGS. 9 and 10.
Figure 12:
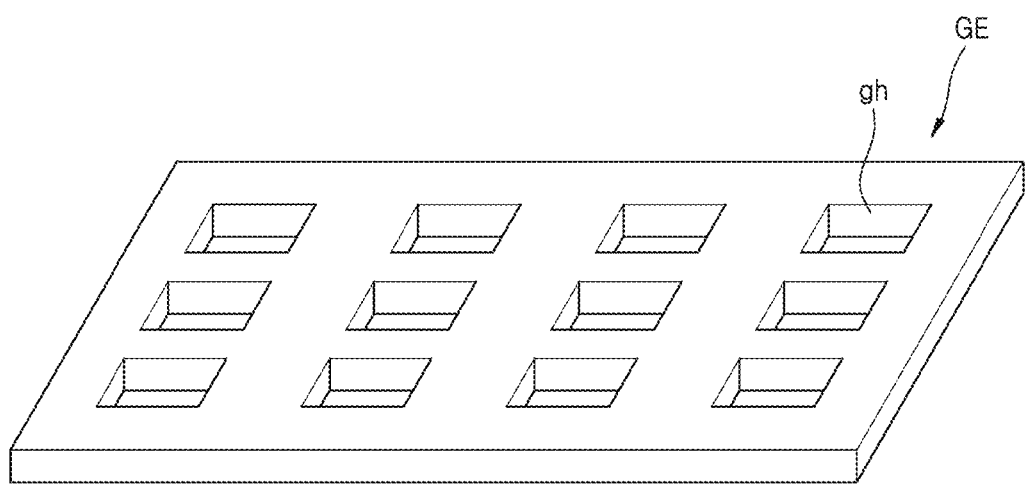

FIGS. 11 and 12 are exemplary perspective views of the intermediate electrode layer GE illustrated in FIGS. 9 and 10.

Referring to FIG. 11, the intermediate electrode layer GE may be a punched metal that is a metal plate in which a plurality of through holes gh is defined. Furthermore, referring to FIG. 12, a plurality of through holes gh having a grid pattern may be defined in the intermediate electrode layer GE. A shape of each of the intermediate electrode layers GE in FIGS. 11 and 12 is only an example, and an embodiment is not limited thereto. In other embodiments, shapes of the through holes gh in the intermediate electrode layer GE and arrangement of the through holes gh may vary, for example.

Figure 13:
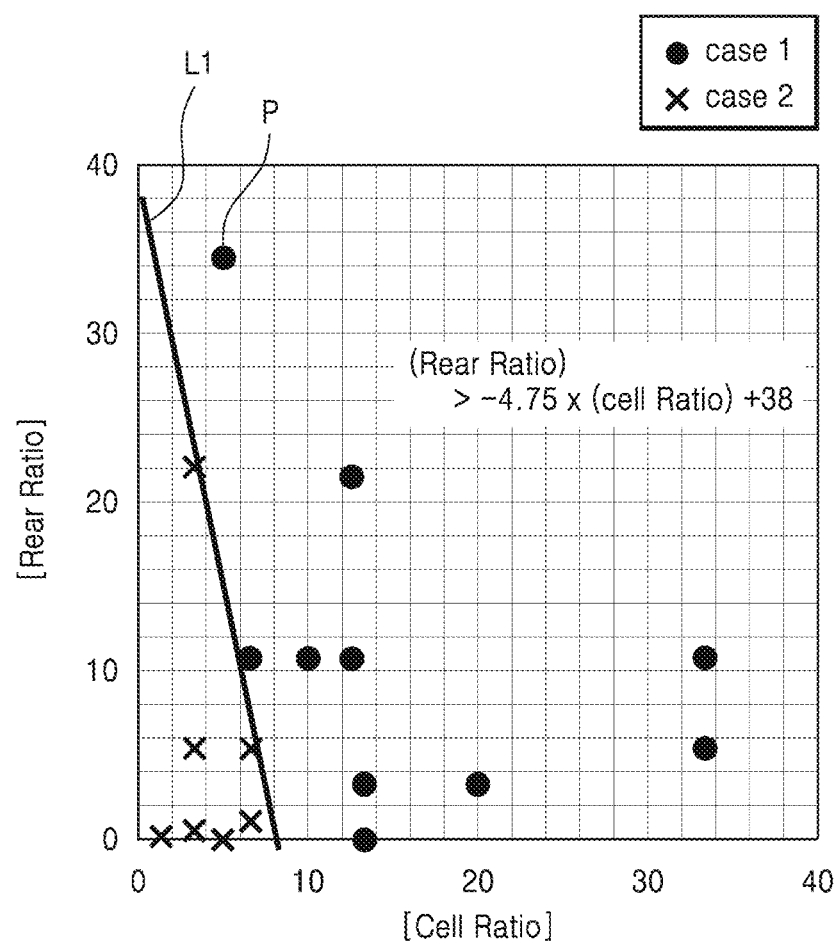
FIG. 13 is a graph illustrating a result of a patterning process according to a change in the parameters described above.

FIG. 13 is a graph illustrating a result of a patterning process according to a change in the parameters described above.

In FIG. 13, a horizontal axis indicates a value of the fourth parameter [Cell Ratio] defined in Numerical equation 5, and a vertical axis indicates a value of the fifth parameter [Rear Ratio] defined in Numerical equation 6. Furthermore, dots in the graph of FIG. 13 indicate the fourth and fifth parameter values in a condition which enables the patterning process. A dot P indicates that the patterning process is performed in a condition where [Cell Ratio] has a value of about 5, and [Rear Ratio] has a value of about 34, for example. In FIG. 13, '●' indicates a case having the mask effect superior than a prescribed reference during the patterning process. Furthermore, 'x' indicates a case having the mask effect lower than a prescribed reference during the patterning process.

Referring to FIG. 13, as [Cell Ratio] and [Rear Ratio] are greater, the mask effect may be improved during the patterning process. In an embodiment, the mask effect of the patterning process may be remarkable in an area where [Cell Ratio] and [Rear Ratio] satisfy Numerical inequation 7 (refer to line L1 in FIG. 13), but the mask effect of the patterning process may be below a reference level in an area where [Cell Ratio] and [Rear Ratio] do not satisfy Numerical inequation 7, for example.

The devices and methods of patterning a substrate according to the embodiments are described above with reference to FIGS. 1 through 13. According to the embodiments described above, the mask effect of the patterning process may be improved by adjusting a plurality of cell electrodes disposed on the first surface S1 of the substrate SU, and the potentials V1 to V4 applied to the spray nozzle No and the second surface S2 of the substrate SU, using voltage driving units.

Hereinafter, a method of manufacturing an organic light-emitting device using the method of patterning a substrate will be described.

Figure 14:
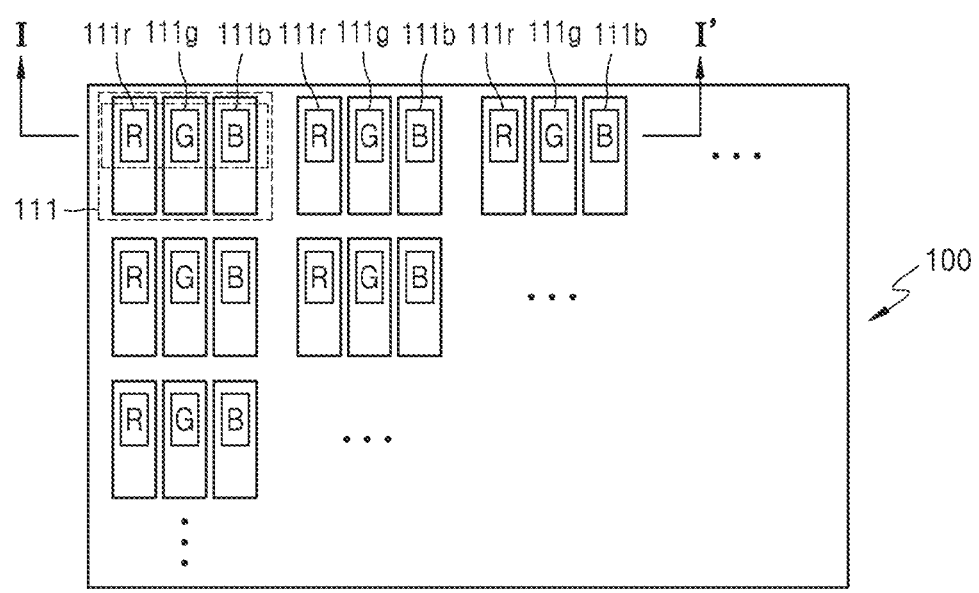
FIG. 14 is a schematic plan view of an organic light-emitting device.

FIG. 14 is a schematic plan view of an organic light-emitting device 100.

Referring to FIG. 14, the organic light-emitting device 100 may include at least one of pixels 111 in a surface thereof. Each of the pixels 111 may include a plurality of sub-pixels 111r, 111g, and 111b. The sub-pixels 111r, 111g, and 111b may include organic layers that are different from one another. In an embodiment, the pixel 111 may include first to third sub-pixels 111r, 111g, and 111b, for example. The first sub-pixel 111r may include an organic layer emitting red R, the second sub-pixel 111g may include an organic layer emitting green G, and the third sub-pixel 111b may include an organic layer emitting blue B. However, the number of sub-pixels and colors emitted by the sub-pixels are not limited thereto and may vary. In an embodiment, the first to third sub-pixels 111r, 111g, and 111b may emit yellow Y, magenta M, and cyan C, respectively, for example. Furthermore, the pixel 111 may include sub pixels that are more than or less than three. In an embodiment, the pixel 111 may include six sub-pixels, for example. The sub-pixels may include organic layers emitting R, G, B, Y, M, and C, respectively.

Figure 15:
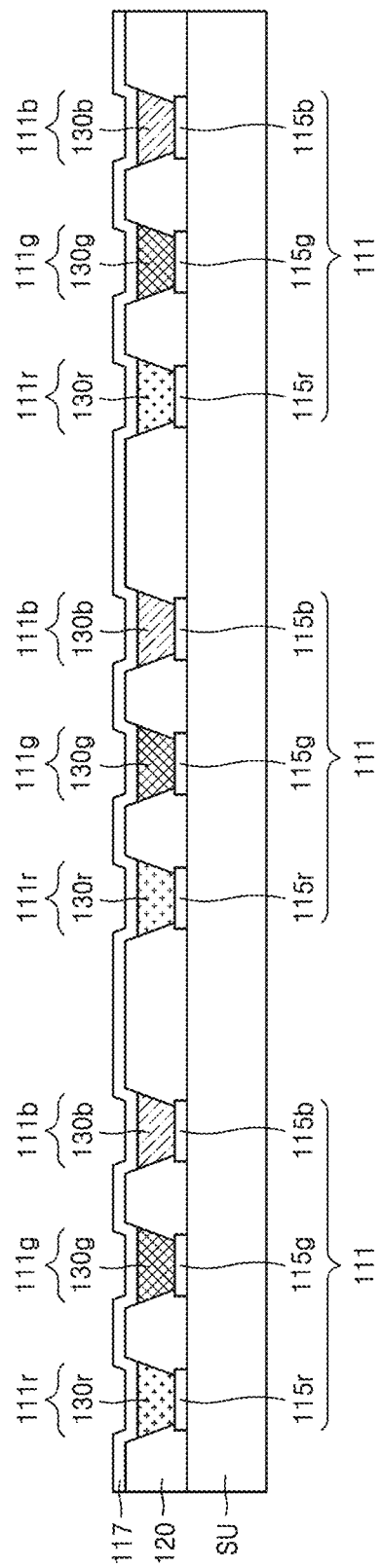
FIG. 15 is a cross-sectional view taken along a line I-I' of FIG. 14.

FIG. 15 is a cross-sectional view taken along a line I-I' of FIG. 14.

Referring to FIG. 15, the organic light-emitting device 100 may include the substrate SU, and lower electrodes 115r, 115g, and 115b on the substrate SU. The lower electrodes 115r, 115g, and 115b may be provided in the sub-pixels 111r, 111g, and 111b, respectively. In an embodiment, the first sub-pixel 111r may include the first lower electrode 115r, the second sub-pixel 111g may include the second lower electrode 115g, and the third sub-pixel 111b may include the third lower electrode 115b, for example. However, it is only an example, and an embodiment is not limited thereto. In another embodiment, the lower electrodes 115r, 115g, and 115b may be realized as common electrodes corresponding to the sub-pixels 111r, 111g, and 111b, for example.

The organic light-emitting device 100, which is provided on the substrate SU, may include a pixel-defining layer 120 surrounding the lower electrodes 115r, 115g, and 115b. The pixel-defining layer 120 may define a sub-pixel area provided later below by forming an opening in an area including the sub-pixels 111r, 111g, and 111b. Spaces in which the organic layers 130r, 130g, and 130b are stacked may be provided by forming slopes on the lower electrodes 115r, 115g, and 115b by the pixel-defining layer 120. Although FIG. 15 illustrates the pixel-defining layer 120, the organic light-emitting device 100 manufactured according to an embodiment may not include the pixel-defining layer 120. In other words, the organic layers 130r, 130g, and 130b may be stacked on the lower electrodes 115r, 115g, and 115b without the slopes of the pixel-defining layer 120. The sub-pixel area provided later below may be defined as areas of the organic layers 130r, 130g, and 130b stacked on the lower electrodes 115r, 115g, and 115b.

The organic light-emitting device 100 may include the organic layers 130r, 130g, and 130b stacked on the lower electrodes 115r, 115g, and 115b, and an upper electrode 117 disposed on the organic layers 130r, 130g, and 130b. The organic layers 130r, 130g, and 130b may be provided in the sub-pixels 111r, 111g, and 111b, respectively. In an embodiment, each of the organic layers 130r, 130g, and 130b may be a first organic layer 130r deposited on the first sub-pixel 111r, a second organic layer 130g deposited on the second sub-pixel 111g, and a third organic layer 130b deposited on the third sub-pixel 111b, for example. The first organic layer 130r may include a first emission layer emitting a first color. Similarly, the second organic layer 130g may include a second emission layer emitting a second color, and the third organic layer 130b may include a third emission layer emitting a third color. The first emission layer may include an organic material emitting the first color. Similarly, the second and third emission layers may include organic materials emitting the second and third colors, respectively. Therefore, when a proper potential is applied to the upper electrode 117 and the lower electrodes 115r, 115g, and 115b, the first to third sub-pixels 111r, 111g, and 111b may emit the first to third colors, respectively.

Figure 16:
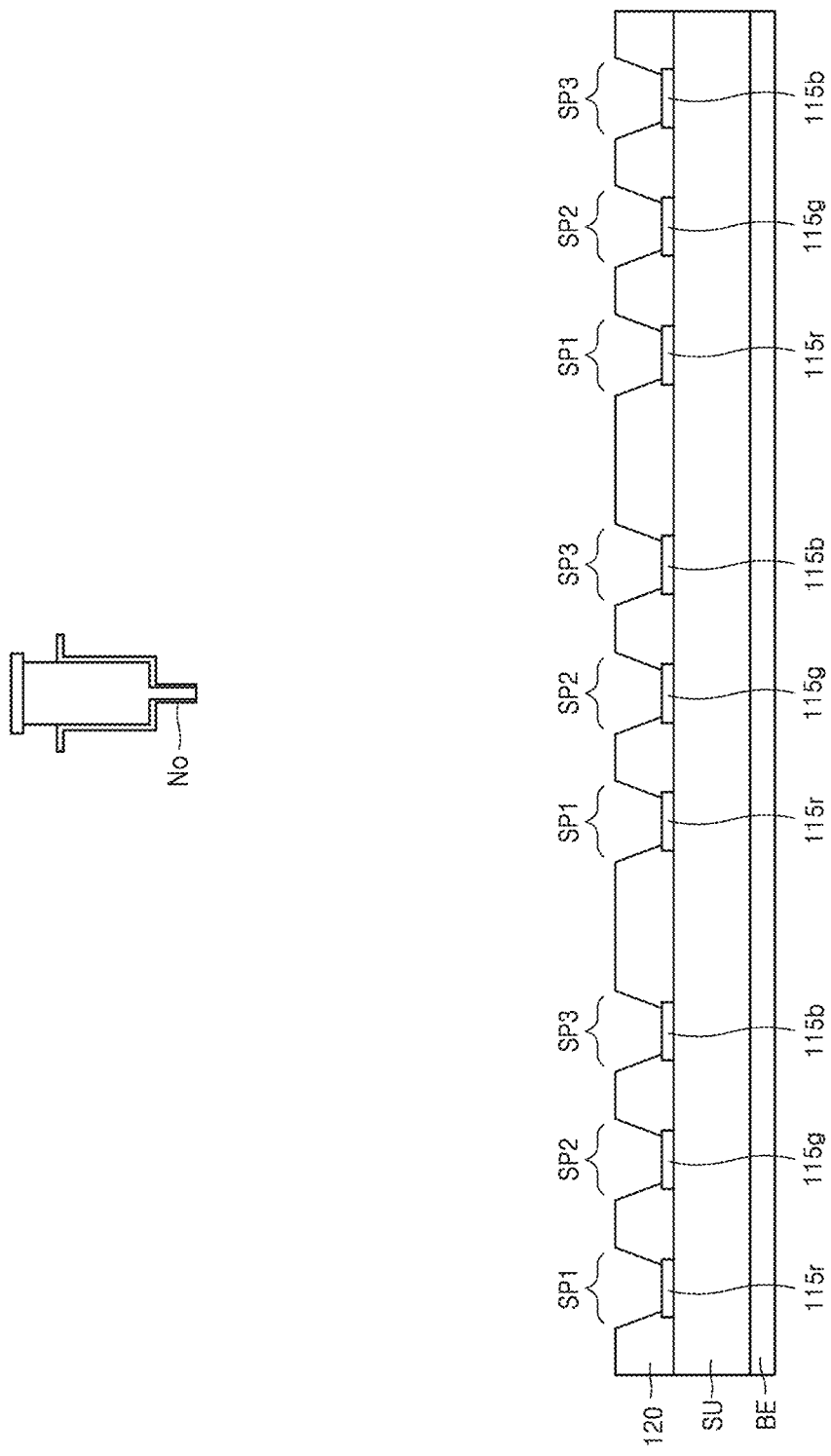
FIG. 16 is a schematic view of providing sub-pixel areas SP1, SP2, and SP3 on a substrate.

FIG. 16 is a schematic view of providing the sub-pixel areas SP1, SP2, and SP3 on the substrate SU.

Referring to FIG. 16, the substrate SU may include the lower electrodes 115r, 115g, and 115b in locations corresponding to the sub-pixels 111r, 111g, and 111b. Furthermore, the pixel-defining layer 120 may be disposed on the substrate SU. Openings exposing the lower electrodes 115r, 115g, and 115b may be defined in the pixel-defining film 120. The pixel-defining film 120 may define the sub-pixel areas SP1, SP2, and SP3 by defining the openings in the substrate SU. The sub-pixel areas SP1, SP2, and SP3 may include the lower electrodes 115r, 115g, and 115b, respectively. The lower electrodes 115r, 115g, and 115b may be provided in the sub-pixel areas SP1, SP2, and SP3, respectively. In an embodiment, a first sub-pixel area SP1 may include the first lower electrode 115r, a second sub-pixel area SP2 may include the second lower electrode 115g, and a third sub-pixel area SP3 may include the third lower electrode 115b, for example. The sub-pixel areas SP1, SP2, and SP3 may include the lower electrodes 115r, 115g, and 115b and areas of the pixel-defining film 120 surrounding the lower electrodes 115r, 115g, and 115b, respectively.

The pixel-defining film 120 may be an insulating layer, but is not limited thereto. In an embodiment, the pixel-defining film 120 may include an organic or inorganic material. In an embodiment, the pixel-defining film 120 may include organic materials such as polyimide, polyamide, benzocyclobutene, an acrylic resin, or a phenolic resin, or inorganic materials such as SiNx, for example. Furthermore, the pixel-defining layer 120 may have various structures like a single-layer structure or a multilayer structure having two or more layers.

Although FIG. 16 illustrates a space in which an organic solution is stacked by the pixel-defining film 120, an embodiment is not limited thereto. In an embodiment, the pixel-defining film 120 may not be provided when the sub-pixel areas SP1, SP2, and SP3 are provided, for example. The sub-pixel areas SP1, SP2, and SP3 may include the lower electrodes 115r, 115g, and 115b and an area of an organic solution being deposited on the lower electrodes 115r, 115g, and 115b.

Figure 17:
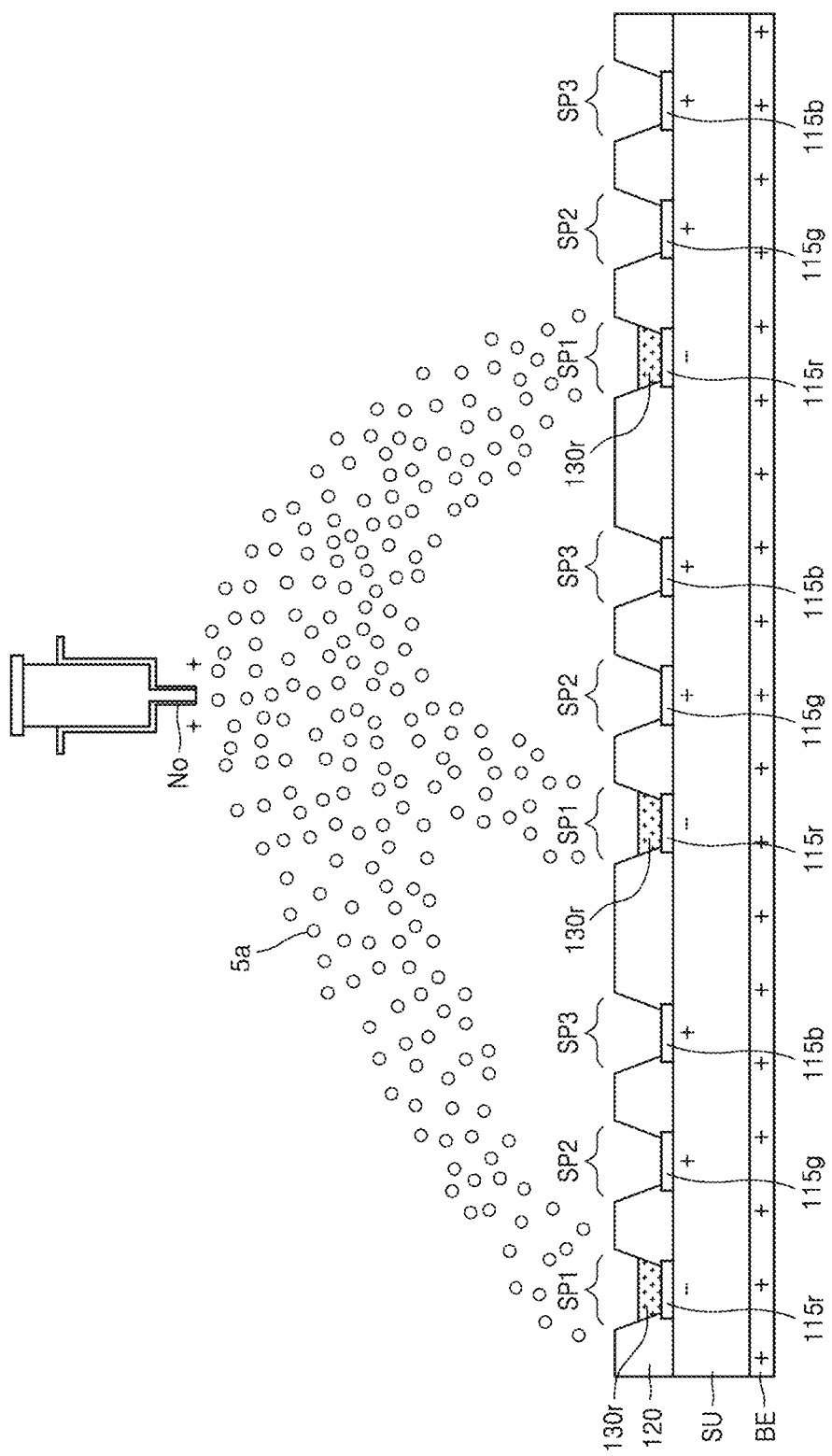
FIG. 17 is a schematic view of spraying an organic solution from a spray nozzle of an organic-solution spray device according to an embodiment.

FIG. 17 is a schematic view of spraying droplets 5a of an organic solution from the spray nozzle No of an organic-solution spray device according to an embodiment.

Referring to FIG. 17, the method of manufacturing the organic light-emitting device according to an embodiment may include an operation of depositing the droplets 5a of a first organic solution to the first sub-pixel area SP1 using the spray nozzle No of the organic-solution spray device. Here, the first potential V1 may be applied to the spray nozzle No. Furthermore, the second potential V2 may be applied to the first sub-pixel area SP1 and the third potential V3 may be applied to the second and third sub-pixel areas SP2 and SP3. Furthermore, the fourth potential V4 may be applied to the back electrode BE. The second potential V2 may be different from each of the first potential V1, the third potential V3, and the fourth potential V4.

FIG. 18 is a view of a resultant according to a deposition process of the droplets 5a of the first organic solution illustrated in FIG. 17.

Referring to FIG. 18, the droplets 5a of the first organic solution may be selectively deposited on the first sub-pixel area SP1. Accordingly, the first organic layer 130r may be provided in the first sub-pixel area SP1. The first organic layer 130r may include an organic material emitting a first color. Therefore, when a prescribed potential is applied to the first organic layer 130r through the upper electrode 117 and the first lower electrode 115r illustrated in FIG. 15, the first organic layer 130r may emit the first color.

Figure 19:
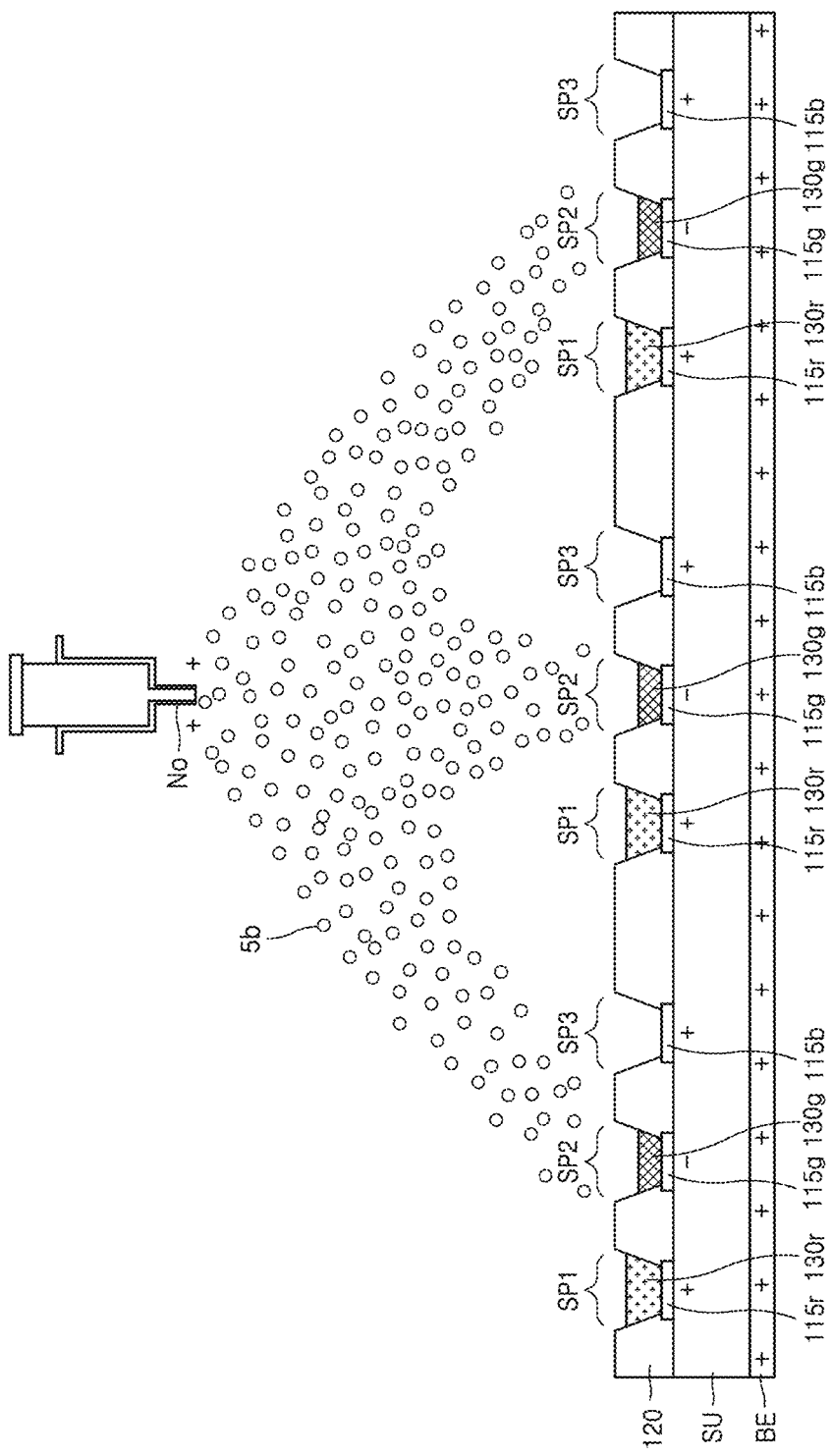
FIG. 19 is a schematic view of selectively depositing droplets of a second organic solution including a light-emitting material of a second color on a second sub-pixel area.

FIG. 19 is a schematic view of selectively depositing droplets 5b of a second organic solution including a light-emitting material of a second color on the second sub-pixel area SP2.

Referring to FIG. 19, the method of manufacturing the organic light-emitting device according to an embodiment may include an operation of depositing the droplets 5b of the second organic solution to the second sub-pixel area SP2 using the spray nozzle No of the organic-solution spray device. Here, the first potential V1 may be applied to the spray nozzle No. Furthermore, the second potential V2 may be applied to the second sub-pixel area SP2 and the third potential V3 may be applied to the first and third sub-pixel areas SP1 and SP3. Furthermore, the fourth potential V4 may be applied to the back electrode BE. The second potential V2 may be different from each of the first potential V1, the third potential V3, and the fourth potential V4. In an embodiment, polarity of the second potential V2 may be different from that of each of the first potential V1, the third potential V3, and the fourth potential V4, for example.

FIG. 20 is a view of a resultant according to the deposition process of the droplets 5b of the second organic solution illustrated in FIG. 19.

Referring to FIG. 20, the droplets 5b of the second organic solution may be selectively deposited on the second sub-pixel area SP2. Accordingly, the second organic layer 130g may be provided in the second sub-pixel area SP2. The second organic layer 130g may include an organic material emitting a second color. Therefore, when a prescribed potential is applied to the second organic layer 130g through the upper electrode 117 and the second lower electrode 115g illustrated in FIG. 15, the second organic layer 130g may emit the second color.

Figure 21:
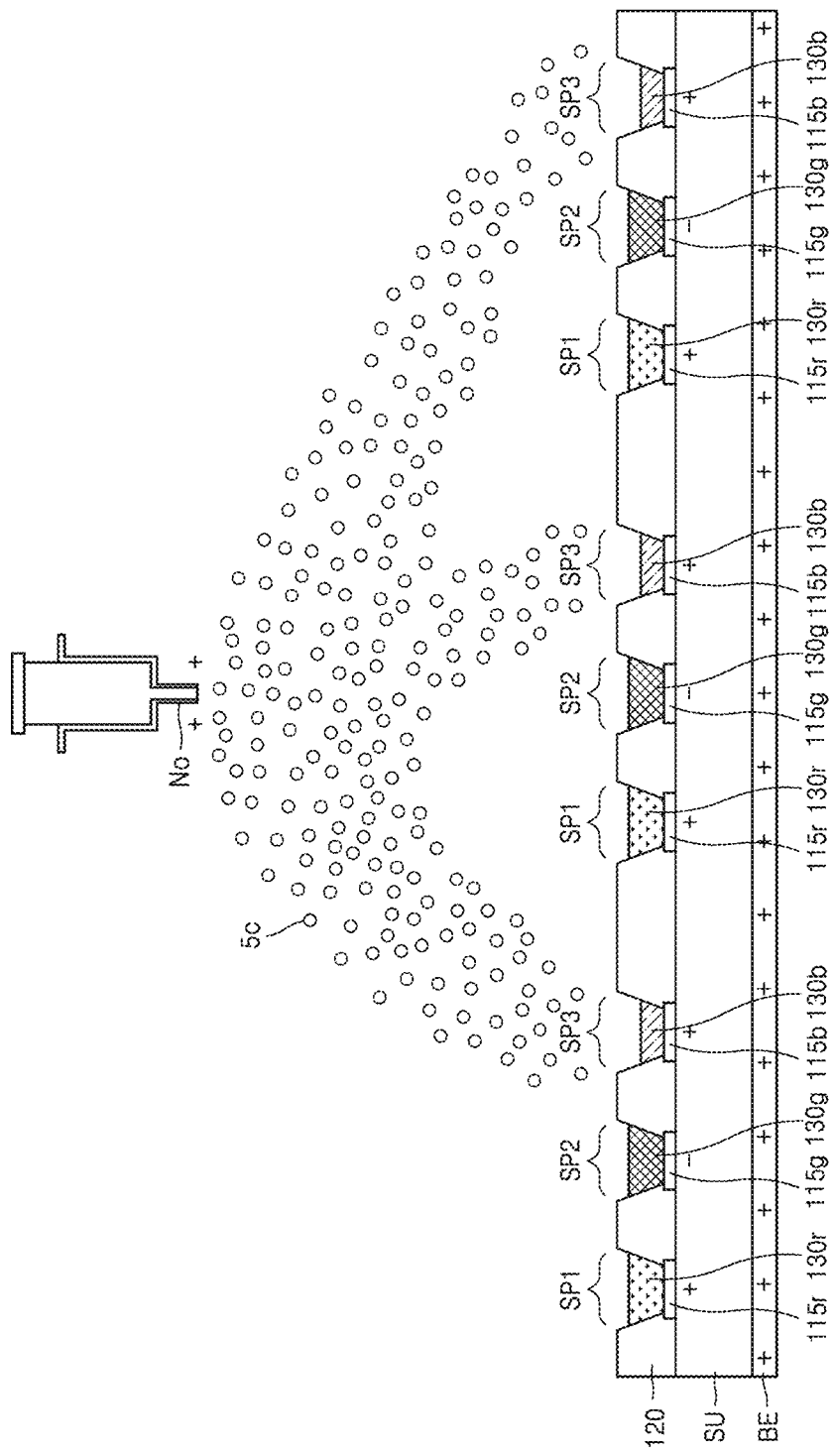
FIG. 21 is a schematic view of selectively depositing droplets of a third organic solution including a light-emitting material of a third color on a third sub-pixel area.

FIG. 21 is a schematic view of selectively depositing droplets 5c of a third organic solution including a light-emitting material of a third color on the third sub-pixel area SP3.

Referring to FIG. 21, the method of manufacturing the organic light-emitting device according to an embodiment may include an operation of depositing the droplets 5c of the third organic solution to the third sub-pixel area SP3 using the spray nozzle No of the organic-solution spray device. Here, the first potential V1 may be applied to the spray nozzle No. Furthermore, the third potential V3 may be applied to the third sub-pixel area SP3 and the third potential V3 may be applied to the first and second sub-pixel areas SP1 and SP2. Furthermore, the fourth potential V4 may be applied to the back electrode BE. Polarity of the second potential V2 may be different from that of each of the first potential V1, the third potential V3, and the fourth potential V4.

FIG. 22 is a view of a resultant according to the deposition process of the droplets 5c of the third organic solution illustrated in FIG. 21.

Referring to FIG. 22, the droplets 5c of the third organic solution may be selectively deposited on the third sub-pixel area SP3. Accordingly, the third organic layer 130b may be provided in the third sub-pixel area SP3. The third organic layer 130b may include an organic material emitting a third color. Therefore, when a prescribed potential is applied to the third organic layer 130b through the upper electrode 117 and the third lower electrode 115b illustrated in FIG. 15, the third organic layer 130b may emit the third color.

Figure 23:
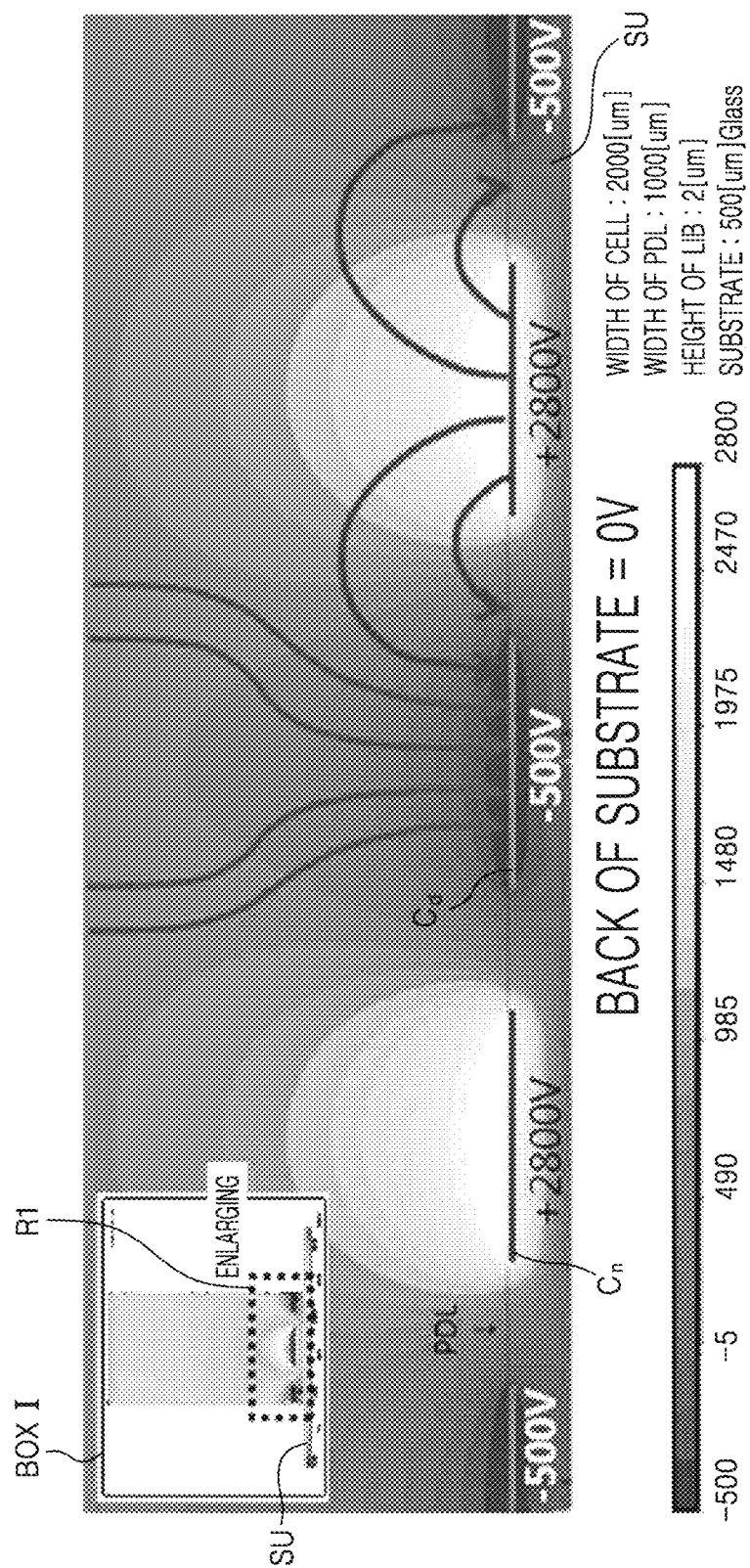
FIGS. 23 to 25 are schematic views of examples generating a mask effect during a patterning process by adjusting first to fourth potentials.
Figure 24:
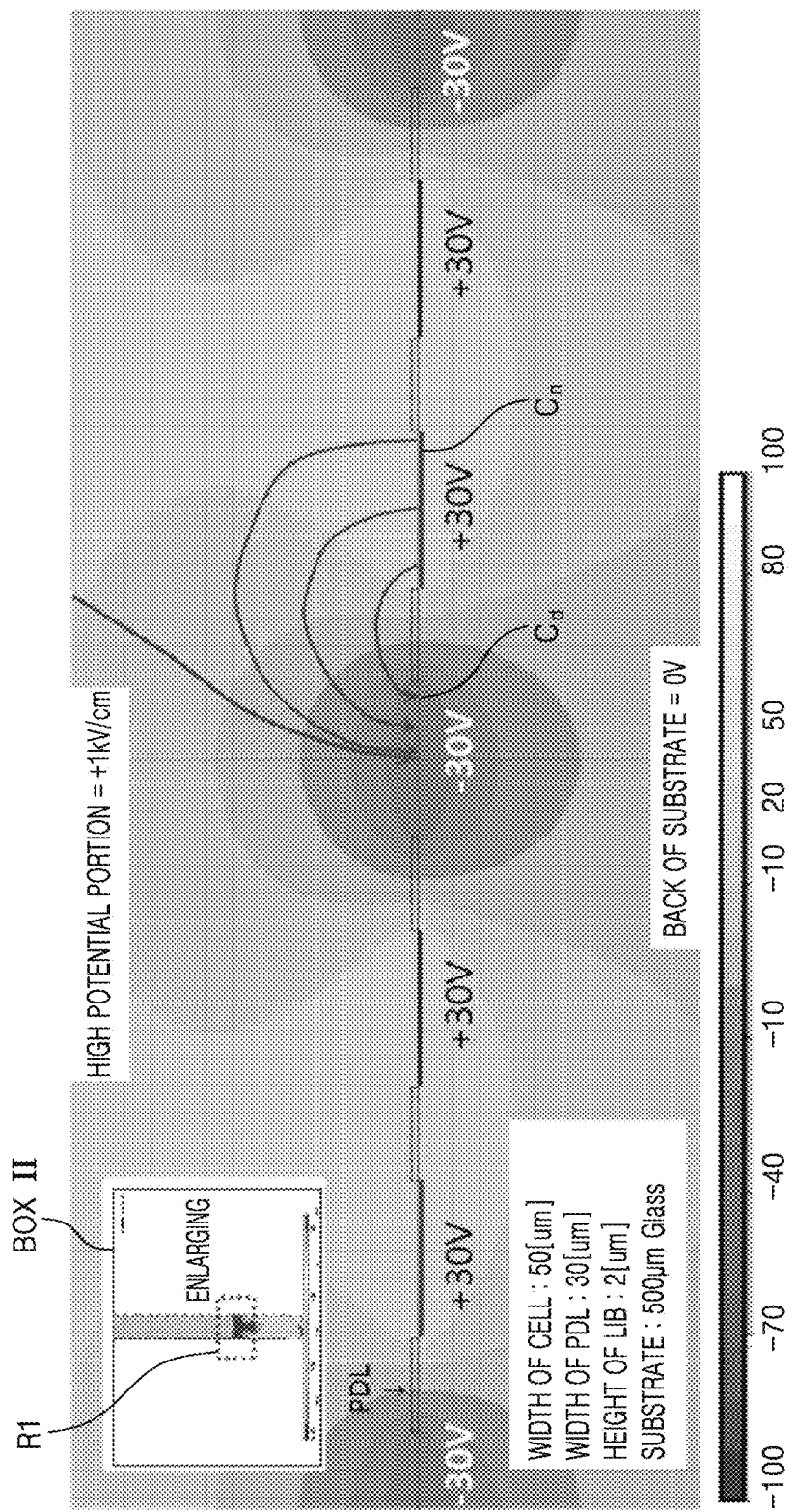
Figure 25:
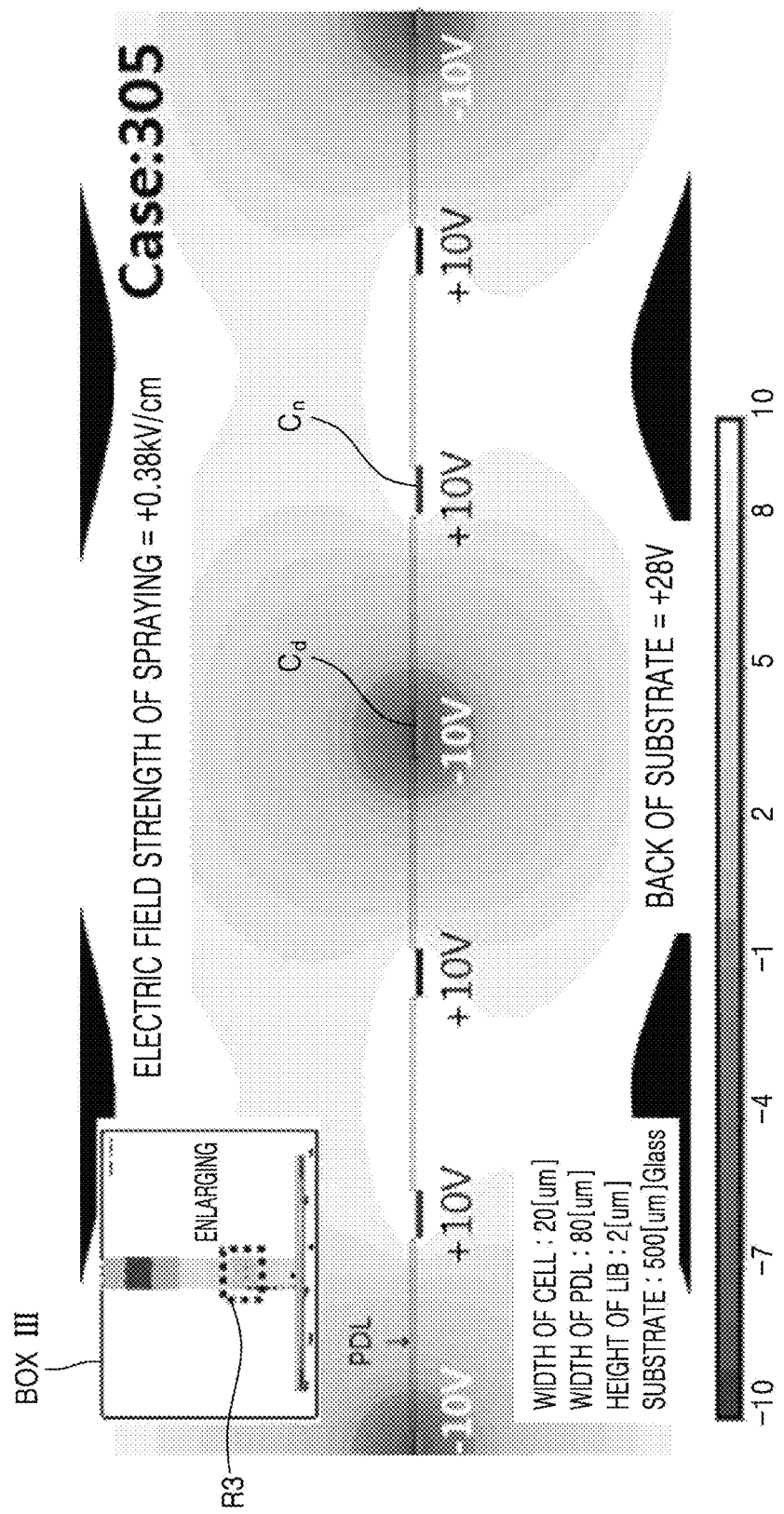

FIGS. 23 to 25 are schematic views of examples generating a mask effect during a patterning process by adjusting the first to fourth potentials V1 to V4.

Figure 26:
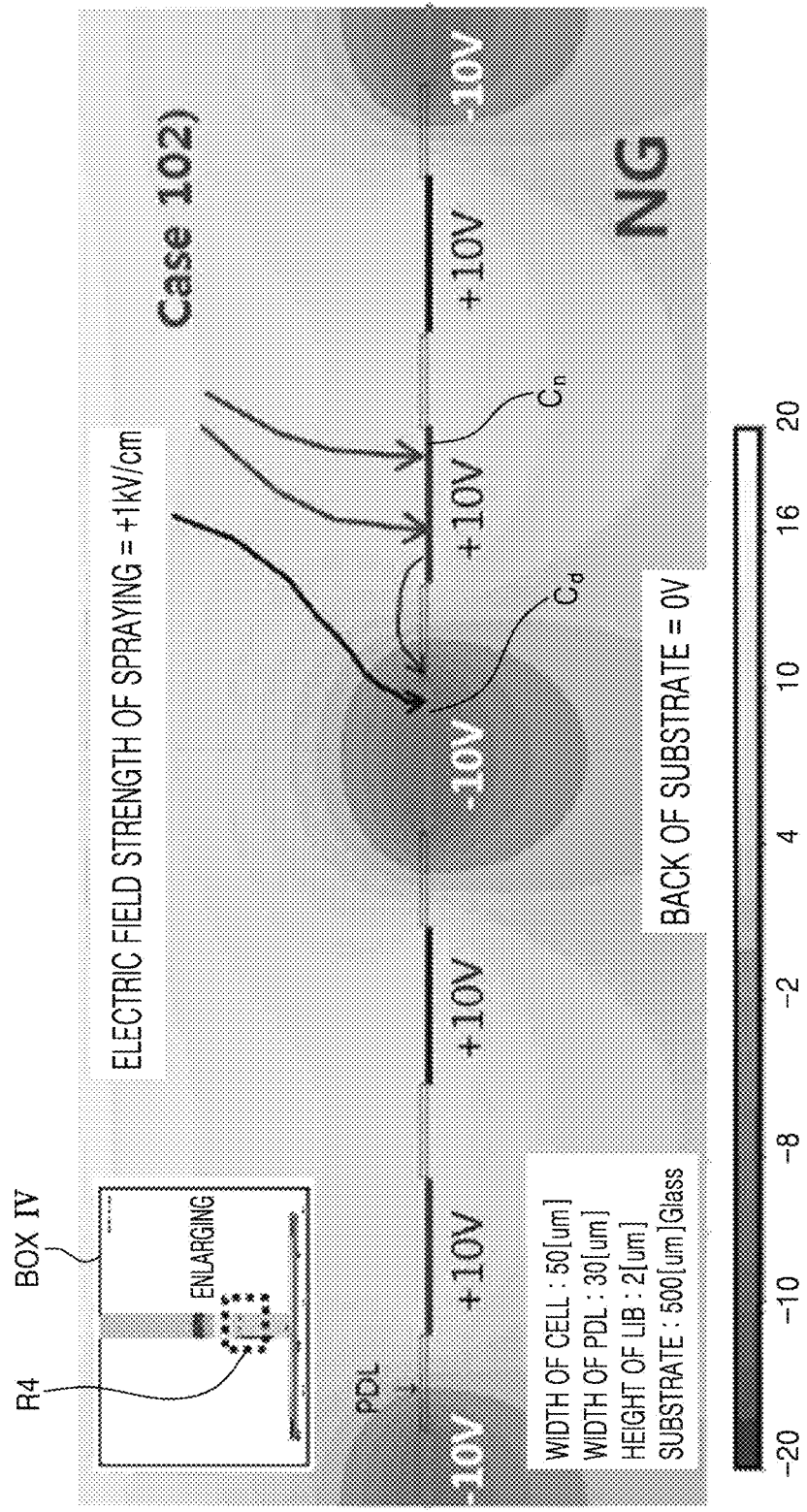
FIG. 26 is a view of an example of a mask effect generated during a patterning process, in which a value of the mask effect is less than a reference value.

FIG. 26 is a view of an example of a mask effect generated during a patterning process, in which a value of the mask effect is less than a reference value.

Equipotential lines illustrated in FIGS. 23 to 26 are two-dimensionally calculated by Laplace's equation using a finite elements method ("FEM"). Furthermore, electric lines of force illustrated in FIGS. 23 to 27 are derived from the equipotential lines.

In FIGS. 23 to 27, the substrate SU may use a glass at a thickness of 500 micrometers (μm). A dielectric constant $\in_S$ of the substrate SU may be approximately 5.4 times greater than the dielectric constant $\in_0$ of air.

In FIG. 23, a distance between the first cell electrode $C_d$ and a second cell electrode $C_n$ is 1 millimeter (mm). Furthermore, the second potential V2 applied to the first cell electrode $C_d$ is −500 volts (V), and the third potential V3 applied to the second cell electrode $C_n$ is 2800 V. Therefore, the second parameter [CF]=[2.8 kilovolts (kV)−(−0.5 kV)]/(1 mm)=33 kilovolts per centimeter (kV/cm) from Numerical equation 1.

Furthermore, a distance between the first cell electrode $C_d$ and the spray nozzle No is 60 mm, and the first potential V1 applied to the spray nozzle No is 2.8 kV. Therefore, first parameter [SF]=[2.8 kV−(−0.5 kV)]/(60 mm)=0.55 kV/cm from Numerical equation 1.

Furthermore, a thickness of the substrate SU is 0.5 mm, and the fourth potential V4 applied to a rear surface of the substrate SU is 0 V. Therefore, the third parameter [RF]=[0 V−(−0.5 kV)]/(0.5 mm)=10 kV/cm from Numerical equation 3.

When the values of the first to third parameters are substituted into Numerical inequation 8, an inequality of Numerical inequation 8 may be satisfied as a left side value of the inequality is approximately 98 and a right side value of the inequality is approximately −247. Therefore, in the embodiment illustrated in FIG. 23, a patterning solution may be selectively deposited on the first cell electrode $C_d$ as a mask effect is stronger due to an electric field.

FIG. 24 sets [SF] as 1 kV/cm. Furthermore, the second potential V2 applied to the first cell electrode $C_d$ is −30 V, and the third potential V3 applied to the second cell electrode $C_n$ is +30 V. Moreover, a distance between the first cell electrode $C_d$ and the second cell electrode $C_n$ is 30 μm, the fourth potential V4 applied to the rear surface of the substrate SU is 0 V, and a thickness of the substrate SU is 0.5 mm.

Here, [RF]=[0 V−(−0.03 kV)]/(0.5 mm)=0.6 kV/cm.

Furthermore, [CF]=[30 V−(−30 V)]/(30 μm)=20 kV/cm.

When the values of the first to third parameters are substituted into Numerical inequation 8, an inequality of Numerical inequation 8 may be satisfied as a left side value of the inequality is approximately 3.24 and a right side value of the inequality is approximately −57. Therefore, in the embodiment illustrated in FIG. 24, a patterning solution may be selectively deposited on the first cell electrode $C_d$ as a mask effect is stronger due to an electric field.

FIG. 25 sets [SF] as 0.38 kV/cm. Furthermore, the second potential V2 applied to the first cell electrode $C_d$ is −10 V, and the third potential V3 applied to the second cell electrode $C_n$ is +10 V. Moreover, a distance between the first cell electrode $C_d$ and the second cell electrode $C_n$ is 80 μm, the fourth potential V4 applied to the rear surface of the substrate SU is 28 V, and a thickness of the substrate SU is 0.5 mm.

Here, [RF]=[28 V−(−10 V)]/(0.5 mm)=0.76 kV/cm.

Furthermore, [CF]=[10 V−(−10 V)]/(30 μm)=6.7 kV/cm.

When the values of the first to third parameters are substituted into Numerical inequation 8, an inequality of Numerical inequation 8 may be satisfied as a left side value of the inequality is approximately 10.8 and a right side value of the inequality is approximately −45.3. Therefore, in the embodiment illustrated in FIG. 25, a patterning solution may be selectively deposited on the first cell electrode $C_d$ as a mask effect is stronger due to an electric field.

FIG. 26 sets [SF] as 1 kV/cm. Furthermore, the second potential V2 applied to the first cell electrode $C_d$ is −10 V, and the third potential V3 applied to the second cell electrode $C_n$ is +10 V. Moreover, a distance between the first cell electrode $C_d$ and the second cell electrode $C_n$ is 30 μm, the fourth potential V4 applied to the rear surface of the substrate SU is 0 V, and a thickness of the substrate SU is 0.5 mm.

Here, [RF]=[0 V−(−10 V)]/(0.5 mm)=0.2 kV/cm.

Furthermore, [CF]=[10 V−(−10 V)]/(30 μm)=6.7 kV/cm.

When the values of the first to third parameters are substituted into Numerical inequation 8, an inequality of Numerical inequation 8 may not be satisfied as a left side value of the inequality is approximately 1.08 and a right side value of the inequality is approximately 6.33. Accordingly, a mask effect due to an electric field may be reduced, and a patterning solution may be deposited not only on the first cell electrode $C_d$ but also on the second cell electrode $C_n$.

Figure 27:
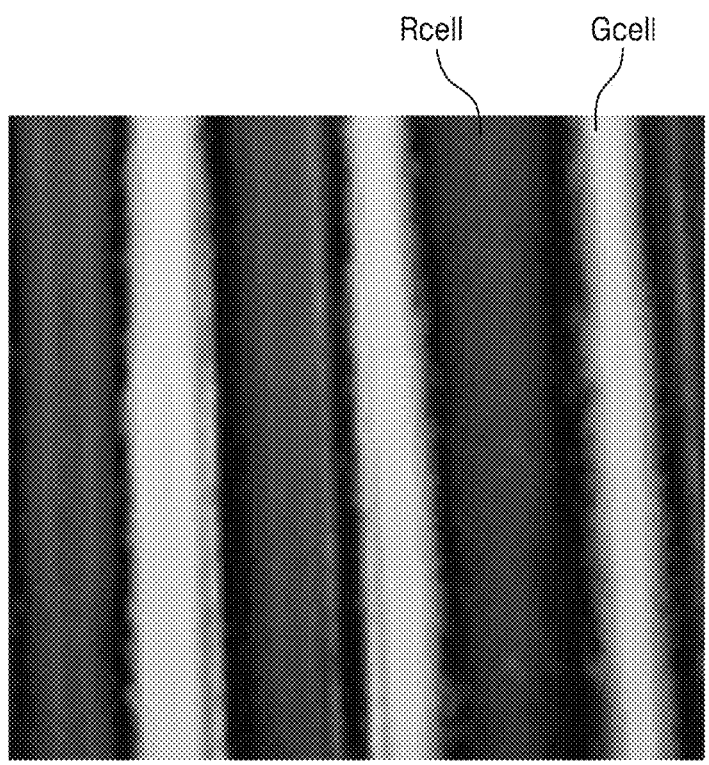
FIG. 27 is a view illustrating a result of selectively patterning a green patterning solution and a red patterning solution in a state of adjusting first to fourth potentials to satisfy Numerical inequations 7 and 8.

FIG. 27 is a view illustrating a result of selectively patterning a green patterning solution and a red patterning solution in a state of adjusting first to fourth potentials V1 to V4 to satisfy Numerical inequations 7 and 8.

When spraying a green patterning solution, the second potential V2 may be applied to a green light-emitting cell Gcell, and the third potential V3 may be applied to a red light-emitting cell Rcell. Whereas, when spraying a red patterning solution, the third potential V3 may be applied to the green light-emitting cell Gcell, and the second potential V2 may be applied to the red light-emitting cell Rcell.

Referring to FIG. 27, the red patterning solution may be selectively deposited on the red light-emitting cells Rcell in an odd-numbered low only. Furthermore, the green patterning solution may be selectively deposited on the green light-emitting cells Gcell in an even-numbered low only. In an embodiment, a mask effect of a patterning process may be improved by applying first to fourth potentials to a spray nozzle, a first cell electrode on which a solution is deposited, a second cell electrode on which a solution is not deposited, and the rear surface of a substrate, and by appropriately adjusting values of the first to fourth potentials, for example.

It should be understood that embodiments described herein should be considered in a descriptive sense only and not for purposes of limitation. Descriptions of features or embodiments within each embodiment should typically be considered as available for other similar features or embodiments in other embodiments.

While one or more embodiments have been described with reference to the figures, it will be understood by those of ordinary skill in the art that various changes in form and details may be made therein without departing from the spirit and scope as defined by the following claims.

What is claimed is:

1. A method of patterning a substrate using a patterning solution, the method comprises:
   applying a first potential to a spray nozzle;
   applying a second potential to at least one first cell electrode among a plurality of cell electrodes on a first surface of the substrate;
   applying a third potential to at least one second cell electrode excluding the at least one first cell electrode among the plurality of cell electrodes;
   applying a fourth potential to a back electrode disposed on a second surface which is opposite to the first surface of the substrate; and
   selectively depositing the patterning solution on the at least one first cell electrode by spraying the patterning solution from the spray nozzle to the first surface of the substrate,
   wherein the second potential is different from each of the first potential, the third potential, and the fourth potential.

2. The method of claim 1, wherein
the first to fourth potentials are adjusted in a manner where a first parameter [SF], a second parameter [CF], and a third parameter [RF] satisfy Numerical inequation 1, $$\frac{\varepsilon_s \cdot [RF]}{\varepsilon_0 \cdot [SF]} > -4.75 \times \frac{[CF]}{[SF]} + 38 \qquad \text{[Numerical inequation 1]}$$

and the first to third parameters [SF], [CF], and [RF] are defined as described below:

$$[SF] \equiv \frac{V1 - V2}{d1}, [CF] \equiv \frac{V3 - V2}{d2}, [RF] \equiv \frac{V4 - V2}{d3}$$

wherein, $\varepsilon_S$ denotes a dielectric constant of the substrate, $\varepsilon_0$ denotes a dielectric constant of air, V1 denotes the first potential, V2 denotes the second potential, V3 denotes the third potential, V4 denotes the fourth potential, d1 denotes the distance between the spray nozzle and the first cell electrode, d2 denotes the distance between the first cell electrode and the second cell electrode, and d3 denotes the thickness of the substrate.

3. The method of claim 1, wherein
the spray nozzle has a needle shape with a sharp end, a ring electrode having a ring shape is provided between the spray nozzle and the substrate, and
the method further comprises:
   applying a fifth potential which is different from the first to fourth potentials to the ring electrode.

4. The method of claim 3, wherein
the second to fifth potentials are adjusted in a manner where a first parameter [SF], a second parameter [CF], and a third parameter [RF] satisfy Numerical inequation 1, $$\frac{\varepsilon_s \cdot [RF]}{\varepsilon_0 \cdot [SF]} > -4.75 \times \frac{CF}{SF} + 38 \qquad \text{[Numerical inequation 1]}$$

and the first to third parameters [SF], [CF], and [RF] are defined as described below:

$$[SF] \equiv \frac{V5 - V2}{h1}, [CF] \equiv \frac{V3 - V2}{h2}, [RF] \equiv \frac{V4 - V2}{h3}$$

wherein, $\varepsilon_S$ denotes a dielectric constant of the substrate, $\varepsilon_0$ denotes a dielectric constant of air, V2 denotes the second potential, V3 denotes the third potential, V4 denotes the fourth potential, V5 denotes the fifth potential, h1 denotes a distance between the ring electrode and the first cell electrode, h2 denotes a distance between the first cell electrode and the second cell electrode, and h3 denotes a thickness of the substrate.

5. The method of claim 1, wherein
an intermediate electrode layer in which a plurality of through holes is defined is provided between the spray nozzle and the substrate, and
the method further comprises:
   applying a fifth potential which is different from the first to fourth potentials to the intermediate electrode layer.

6. The method of claim 5, wherein
the second to fifth potentials are adjusted in a manner where a first parameter [SF], a second parameter [CF], and a third parameter [RF] satisfy Numerical inequation 1, $$\frac{\varepsilon_s \cdot [RF]}{\varepsilon_0 \cdot [SF]} > -4.75 \times \frac{[CF]}{[SF]} + 38 \qquad \text{[Numerical inequation 1]}$$

and the first to third parameters [SF], [CF], and [RF] are defined as described below:

$$[SF] \equiv \frac{V5 - V2}{h4}, [CF] \equiv \frac{V3 - V2}{h2}, [RF] \equiv \frac{V4 - V2}{h3}$$

wherein, $\varepsilon_S$ denotes a dielectric constant of the substrate, $\varepsilon_0$ denotes a dielectric constant of air, V2 denotes the second potential, V3 denotes the third potential, V4 denotes the fourth potential, V5 denotes the fifth potential, h4 denotes a distance between the intermediate electrode layer and the first cell electrode, h2 denotes a distance between the first cell electrode and the second cell electrode, and h3 denotes a thickness of the substrate.

7. The method of claim 5, wherein
the intermediate electrode layer is a punched metal.

8. The method of claim 5, wherein
the plurality of through holes having a grid pattern is defined in the intermediate electrode layer.

9. The method of claim 1, wherein
each of the first potential, third potential, and fourth potential has a positive potential value, and the second potential has a negative potential value.

10. A device for patterning a substrate using a patterning solution, the device comprising:
a spray nozzle which sprays the patterning solution toward a first surface of the substrate;
a back electrode disposed on a second surface which is opposite to the first surface of the substrate; and
a plurality of cell electrodes disposed on the first surface of the substrate, and a voltage driving unit which adjusts potentials of the spray nozzle and the back electrode, wherein
the voltage driving unit applies a first potential to the spray nozzle, applies a second potential to at least one first cell electrode among the plurality of cell electrodes, applies a third potential to at least one second cell electrode excluding the at least one first cell electrode among the plurality of cell electrodes, and applies a fourth potential to the back electrode, and
the second potential is different from each of the first potential, the third potential, and the fourth potential,
wherein the voltage driving unit adjusts the first to fourth potentials in a manner where a first parameter [SF], a second parameter [CF], and a third parameter [RF] satisfy Numerical inequation 1, $$\frac{\varepsilon_s \cdot [RF]}{\varepsilon_0 \cdot [SF]} > -4.75 \times \frac{CF}{SF} + 38 \qquad \text{[Numerical inequation 1]}$$

and the first to third parameters [SF], [CF], and [RF] are defined as described below:

$$[SF] \equiv \frac{V1 - V2}{d1}, \; [CF] \equiv \frac{V3 - V2}{d2}, \; [RF] \equiv \frac{V4 - V2}{d3}$$

wherein, $\varepsilon_S$ denotes a dielectric constant of the substrate, $\varepsilon_0$ denotes a dielectric constant of air, V1 denotes a first potential, V2 denotes a second potential, V3 denotes a third potential, V4 denotes a fourth potential, d1 denotes a distance between the spray nozzle and the first cell electrode, d2 denotes a distance between the first cell electrode and the second cell electrode, and d3 denotes a thickness of the substrate.

11. The device of claim 10, wherein
the spray nozzle has a needle shape with a sharp end, and further comprising:
a ring electrode having a ring shape between the spray nozzle and the substrate,
the voltage driving unit applies a fifth potential to the ring electrode, and
the fifth potential is different from the first to fourth potentials.

12. The device of claim 11, wherein
the voltage driving unit adjusts the second to fifth potentials in a manner where a first parameter [SF], a second parameter [CF], and a third parameter [RF] satisfy Numerical inequation 1, $$\frac{\varepsilon_s \cdot [RF]}{\varepsilon_0 \cdot [SF]} > -4.75 \times \frac{CF}{SF} + 38 \qquad \text{[Numerical inequation 1]}$$

and the first to third parameters [SF], [CF], and [RF] are defined as described below:

$$[SF] \equiv \frac{V5 - V2}{h1}, \; [CF] \equiv \frac{V3 - V2}{h2}, \; [RF] \equiv \frac{V4 - V2}{h3}$$

wherein, $\varepsilon_S$ denotes a dielectric constant of the substrate, $\varepsilon_0$ denotes a dielectric constant of air, V2 denotes a second potential, V3 denotes a third potential, V4 denotes a fourth potential, V5 denotes a fifth potential, h1 denotes a distance between the ring electrode and the first cell electrode, h2 denotes a distance between the first cell electrode and the second cell electrode, and h3 denotes a thickness of the substrate.

13. The device of claim 10, further comprising:
an intermediate electrode layer which is disposed between the spray nozzle and the substrate and in which a plurality of through holes is defined,
the voltage driving unit applies a fifth potential to the intermediate electrode layer, and
the fifth potential is different from the first to fourth potentials.

14. The device of claim 13, wherein
the voltage driving unit adjusts the second to fifth potentials in a manner where a first parameter [SF], a second parameter [CF], and a third parameter [RF] satisfy Numerical inequation 1, $$\frac{\varepsilon_s \cdot [RF]}{\varepsilon_0 \cdot [SF]} > -4.75 \times \frac{CF}{SF} + 38 \qquad \text{[Numerical inequation 1]}$$

and the first to third parameters [SF], [CF], and [RF] are defined as described below:

$$[SF] \equiv \frac{V5 - V2}{h4}, \; [CF] \equiv \frac{V3 - V2}{h2}, \; [RF] \equiv \frac{V4 - V2}{h3}$$

wherein, $\varepsilon_S$ denotes a dielectric constant of the substrate, $\varepsilon_0$ denotes a dielectric constant of air, V2 denotes the second potential, V3 denotes the third potential, V4 denotes the fourth potential, V5 denotes the fifth potential, h4 denotes a distance between the intermediate electrode layer and the first cell electrode, h2 denotes a distance between the first cell electrode and the second cell electrode, and h3 denotes a thickness of the substrate.

15. The device of claim 13, wherein
the intermediate electrode layer is a punched metal.

16. The device of claim 13, wherein
the plurality of through holes having a grid pattern is defined in the intermediate electrode layer.

* * * * *